United States Patent
Nagaya et al.

(10) Patent No.: US 11,226,442 B2
(45) Date of Patent: *Jan. 18, 2022

(54) OPTICAL FILTER AND AMBIENT LIGHT SENSOR INCLUDING OPTICAL FILTER

(71) Applicant: JSR Corporation, Minato-ku (JP)

(72) Inventors: Katsuya Nagaya, Minato-ku (JP); Toshihiro Otsuki, Minato-ku (JP); Takashi Tsubouchi, Minato-ku (JP)

(73) Assignee: JSR Corporation, Minato-ku (JP)

( * ) Notice: Subject to any disclaimer, the term of this patent is extended or adjusted under 35 U.S.C. 154(b) by 114 days.

This patent is subject to a terminal disclaimer.

(21) Appl. No.: 16/239,243

(22) Filed: Jan. 3, 2019

(65) Prior Publication Data

US 2019/0137670 A1   May 9, 2019

Related U.S. Application Data

(63) Continuation of application No. 15/711,836, filed on Sep. 21, 2017, now Pat. No. 10,473,836, which is a (Continued)

(51) Int. Cl.
*G02B 5/22* (2006.01)
*G01J 1/04* (2006.01)
(Continued)

(52) U.S. Cl.
CPC .................. *G02B 5/22* (2013.01); *G01J 1/02* (2013.01); *G01J 1/04* (2013.01); *G01J 1/0403* (2013.01);
(Continued)

(58) Field of Classification Search
CPC ...... G01J 1/0403; G01J 1/0488; G01J 1/0271; G01J 2003/1213; G02B 5/208;
(Continued)

(56) References Cited

U.S. PATENT DOCUMENTS

| 4,857,431 A | 8/1989 | Kato et al. |
| 5,296,519 A | 3/1994 | Otsuka |
(Continued)

FOREIGN PATENT DOCUMENTS

| CN | 101441291 A | 5/2009 |
| JP | 60-228448 | 11/1985 |
(Continued)

OTHER PUBLICATIONS

International Search Report dated Oct. 18, 2016 in PCT/JP2016/071896 filed Jul. 26, 2016 (with English Translation).

(Continued)

*Primary Examiner* — Jade R Chwasz
(74) *Attorney, Agent, or Firm* — Oblon, McClelland, Maier & Neustadt, L.L.P.

(57) ABSTRACT

An optical filter including a base member having a layer containing near-infrared absorbing fine particles and a dielectric multilayer film, the optical filter satisfying a requirement that, in a wavelength range of 400 nm to 650 nm, an average of transmittance of any of light incident from a direction perpendicular to the optical filter, light obliquely incident at an angle of 30 degrees, and light obliquely incident at an angle of 60 degrees is 45% or higher and lower than 85%; and a requirement that, in a wavelength range of 800 nm to 1,200 nm, an average of optical density (OD value) of any of light incident from the direction perpendicular to the optical filter, light obliquely incident at an angle of 30 degrees with respect to the perpendicular direction, and light obliquely incident at an angle of 60 degrees with respect to the perpendicular direction is 1.7 or higher.

15 Claims, 11 Drawing Sheets

Related U.S. Application Data continuation of application No. PCT/JP2016/071896, filed on Jul. 26, 2016.

(51) Int. Cl.
*H01L 31/0232* (2014.01)
*G01J 1/02* (2006.01)
*G02B 5/28* (2006.01)
*G01J 1/42* (2006.01)
*H01L 31/0216* (2014.01)
*H01L 31/08* (2006.01)

(52) U.S. Cl.
CPC .......... *G01J 1/0448* (2013.01); *G01J 1/0488* (2013.01); *G01J 1/4204* (2013.01); *G02B 5/28* (2013.01); *H01L 31/0232* (2013.01); *H01L 31/02162* (2013.01); *H01L 31/02322* (2013.01); *H01L 31/08* (2013.01); *G01J 1/0271* (2013.01)

(58) Field of Classification Search
CPC ........ G02B 5/22; G02B 5/206; G02B 5/0875; G02B 5/20; G02B 5/003; G02B 5/0284; G02B 1/10; G02B 5/0242; G02B 5/207; G02B 5/281; G02B 6/12004
USPC .................. 359/885, 892, 359, 360, 361
See application file for complete search history.

(56) References Cited

U.S. PATENT DOCUMENTS

| | | | | |
|---|---|---|---|---|
| 5,523,027 | A | | 6/1996 | Otsuka |
| 6,020,490 | A | | 2/2000 | Reinehr et al. |
| 10,473,836 | B2 | * | 11/2019 | Nagaya .................... G02B 5/22 |
| 2004/0137367 | A1 | | 7/2004 | Kitayama et al. |
| 2006/0178254 | A1 | | 8/2006 | Takeda et al. |
| 2009/0116100 | A1 | | 5/2009 | Ota et al. |
| 2010/0220388 | A1 | | 9/2010 | Suzuki et al. |
| 2012/0243077 | A1 | | 9/2012 | Osawa |
| 2015/0138661 | A1 | | 5/2015 | Blair |
| 2015/0146057 | A1 | * | 5/2015 | Konishi .................... C03C 3/16 |
| | | | | 348/294 |
| 2016/0018576 | A1 | * | 1/2016 | Yamamoto .............. C09B 49/12 |
| | | | | 359/359 |

FOREIGN PATENT DOCUMENTS

| | | |
|---|---|---|
| JP | 63-124054 | 5/1988 |
| JP | 1-146846 | 6/1989 |
| JP | 1-228960 | 9/1989 |
| JP | 2846091 | 1/1999 |
| JP | 2864475 | 3/1999 |
| JP | 3366697 | 1/2003 |
| JP | 3699464 | 9/2005 |
| JP | 3703869 | 10/2005 |
| JP | 2006-199945 | 8/2006 |
| JP | 2007-169315 | 7/2007 |
| JP | 4081149 | 4/2008 |
| JP | 2008-163107 | 7/2008 |
| JP | 2008-163194 | 7/2008 |
| JP | 2008-181121 | 8/2008 |
| JP | 2009-108267 | 5/2009 |
| JP | 2009-114326 | 5/2009 |
| JP | 2010-241873 | 10/2010 |
| JP | 2010-285505 | 12/2010 |
| JP | 2010-287310 | 12/2010 |
| JP | 2011-60788 | 3/2011 |
| JP | 2011-100084 | 5/2011 |
| JP | 2011-118255 | 6/2011 |
| JP | 2011-133532 A | 7/2011 |
| JP | 4740631 | 8/2011 |
| JP | 2011-197450 | 10/2011 |
| JP | 2012-8532 | 1/2012 |
| JP | 2012-042918 | 3/2012 |
| JP | 2012-103340 A | 5/2012 |
| JP | 2012-194270 | 10/2012 |
| JP | 2012-201686 | 10/2012 |
| JP | WO 2012/169447 A1 | 12/2012 |
| JP | 2013-156460 | 8/2013 |
| JP | 2014-59550 | 4/2014 |
| JP | WO 2014/168189 A1 | 10/2014 |
| WO | WO 2005/037932 A1 | 4/2005 |

OTHER PUBLICATIONS

Written Opinion dated Oct. 18, 2016 in PCT/JP2016/071896 filed Jul. 26, 2016.
H. Shirai, et al., "Phthalocyanines—Chemistry and Functions", Industrial Publishing & Consulting, Inc., 1997, 17 pages.
English Translation of Written Opinion of the International Search Authority dated Dec. 1, 2017 for the PCT application No. PCT/JP2016/071896.
Office Action dated May 23, 2017, in Japanese Application No. 2017-518176.
Combined Taiwanese Office Action and Search Report dated Feb. 19, 2020 in Patent Application No. 105123537 (with partial English translation), 21 pages.
Notice of Reasons for Revocation dated May 7, 2019 for the Japanese Patent No. 6380624 (with partial English translation) 12 pages.
Combined Chinese Office Action and Search Report dated Sep. 10, 2019 in Patent Application No. 201680002208. 4 (with partial unedited computer generated English translation and English translation of categories of cited documents), 14 pages.
Office Action dated Jan. 23, 2019 in co-pending U.S. Appl. No. 15/711,836, 17 pages.
"Optical Data Sheet" Sumitomo Metal Mining Co., retrieved from http://www.smm.co.jp/E/products/material/ink/pdf/ODS_YMF-02A_en.pdf, 4 pages, (with English translation).
"Safety Data Sheet" retrieved from http://www.smm.co.jp/E/products/material/ink/pdf/ODS_YMF-02A_en.pdf, May 26, 2011, 22 pages, (with English translation).

* cited by examiner

OPTICAL FILTER AND AMBIENT LIGHT SENSOR INCLUDING OPTICAL FILTER

CROSS-REFERENCE TO RELATED APPLICATIONS

This application is a continuation application from U.S. application Ser. No. 15/711,836, filed on Sep. 21, 2017, which is based upon and claims the benefit of priority from the prior Japanese Patent Application No. 2015-148692, filed on Jul. 28, 2015 and PCT International Patent Application No. PCT/JP2016/071896, filed on Jul. 26, 2016, the entire contents of which are incorporated herein by reference.

FIELD

The present invention relates to an optical filter and an ambient light sensor including an optical filter. Specifically, the present invention relates to an optical filter having an infrared absorbing layer containing near-infrared absorbing particles and a dielectric multilayer film, and an ambient light sensor including the optical filter.

BACKGROUND

In recent years, the development of illumination sensors and ambient light sensors to be used for information terminal devices, such as smart phones and tablet terminals, has been proceeded. In information terminal devices, illumination sensors are used for detecting the illuminance of environments around the information terminal devices and controlling the brightness of displays, and ambient light sensors are used for adjusting the color tones of displays.

To match human visibility and the luminance and the color tone of a display in a natural manner, it is important that only visible light is allowed to reach an ambient light sensor. For example, when an ambient light sensor is provided with an optical filter such as a near-infrared cut filter, the spectral sensitivity properties of the sensor can be closer to the visibility.

On the other hand, a request to put higher importance on the design of information terminal devices have led to a required for reducing the transmittance of a transmission window through which light enters an ambient light sensor (a required for making the window have a blackish appearance), and accordingly, a problem has arisen that the amount of incidence of visible light with respect to infrared light decreases, and accurate detection of illuminance and color tones becomes difficult, whereby a malfunction occurs. Furthermore, information terminal devices become lower in height, whereby the distance from a window for light incidence to an ambient light sensor is shorter, and accordingly, for example, the ratio of incident light at a high incident angle such as an incident angle of 60 degrees increases, and it has been required that, even in the case of incident light at a high incident angle, the spectral properties (particularly, the intensity of near-infrared rays) of light that reaches the ambient light sensor do not change.

As a means for matching the spectral properties of an ambient light sensor and human visibility, there has been disclosed a device provided with an infrared cut filter formed of a multilayer metal film on a glass plate (for example, refer to Japanese Unexamined Patent Application Publication No. 2011-060788). However, the optical properties of such near-infrared cut filter formed of a multilayer metal film on a glass plate greatly changes with the incident angle of incident light. Therefore, a problem has arisen that the detection accuracy of the ambient light sensor decreases.

On the other hand, various near-infrared absorbing particles are known as a means for blocking broadband near-infrared rays, independently of incident angles (for example, refer to WO 2005/037932 and Japanese Unexamined Patent Application Publication No. 2011-118255). To achieve sufficient near-infrared blocking performance for an ambient light sensor by using these near-infrared absorbing particles, a larger amount of the near-infrared absorbing particles needs to be added. However, there is a problem that a larger amount of the near-infrared absorbing particles added to a near-infrared cut filter causes a decrease in visible light transmittance.

By contrast, a near-infrared cut filter including a norbornene-based resin substrate, a near-infrared absorbing dye having the absorption maximum at a specific wavelength, and a near-infrared reflection film has a property that a change in transmittance in the visible range when light enters the filter from an oblique direction is smaller (for example, refer to Japanese Unexamined Patent Application Publication No. 2011-100084). However, to use this near-infrared cut filter for an ambient light sensor, it is desirable that the performance of blocking infrared rays at a high incident angle such as an incident angle of 60 degrees is further improved.

SUMMARY

According to an embodiment of the present invention, an optical filter including a base member including a layer containing near-infrared absorbing fine particles and a dielectric multilayer film provided on at least one side of the base member, the optical filter satisfying requirements (a) and (b) below.

(a) In a wavelength range of 400 nm to 650 nm, the average of transmittance of any of light incident from a direction perpendicular to the optical filter, light obliquely incident at an angle of 30 degrees with respect to the perpendicular direction, and light obliquely incident at an angle of 60 degrees with respect to the perpendicular direction is 45% or higher and lower than 85%.

(b) In a wavelength range of 800 nm to 1,200 nm, the average of optical density (OD value) of any of light incident from the direction perpendicular to the optical filter, light obliquely incident at an angle of 30 degrees with respect to the perpendicular direction, and light obliquely incident at an angle of 60 degrees with respect to the perpendicular direction is 1.7 or higher.

In an embodiment of the present invention, the near-infrared absorbing fine particles may have an average particle diameter of 1 nm to 200 nm.

In an embodiment of the present invention, the near-infrared absorbing fine particles may be at least one of first fine particles and second fine particles each defined as follows.

First fine particles: an oxide represented by a general formula $A_{1/n}CuPO_4$ (where A is at least one selected from the group consisting of alkali metals, alkaline earth metals, and $NH_4$; and n is 1 when A is an alkali metal or $NH_4$, or 2 when A is an alkaline earth metal).

Second fine particles: a metal oxide represented by a general formula $M_xW_yO_z$ (where M is one or a plurality of elements selected from H, alkali metals, alkaline earth metals, rare earth elements, Mg, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, F, P, S, Se, Br, Te, Ti, Nb, V, Mo, Ta, Re, Be, Hf, Os, Bi, and I; W is tungsten; O is oxygen; $0.001 \leq x/y \leq 1$; and $2.2 \leq z/y \leq 3.0$).

In an embodiment of the present invention, the layer containing the near-infrared absorbing fine particles in the optical filter may be a transparent resin layer. Furthermore, a dielectric multilayer film may be provided on both sides of the base member of the optical filter.

In an embodiment of the present invention, the optical filter preferably further satisfies the following requirement (c).

(c) In a wavelength range of 400 nm to 650 nm, the average of transmittance of light obliquely incident at an angle of 30 degrees with respect to a direction perpendicular to the optical filter is higher than the average of transmittance of light incident from the direction perpendicular to the optical filter and light obliquely incident at an angle of 60 degrees with respect to the perpendicular direction.

In an embodiment of the present invention, the base member may include a support formed of a transparent resin substrate or a glass substrate. The transparent resin is preferably at least one resin selected from the group consisting of a cyclic (poly)olefin-based resin, an aromatic polyether-based resin, a polyimide-based resin, a fluorene polycarbonate-based resin, a fluorene polyester-based resin, a polycarbonate-based resin, a polyamide-based resin, a polyarylate-based resin, a polysulfone-based resin, a polyether sulfone-based resin, a polyparaphenylene-based resin, a polyamide-imide-based resin, a polyethylene naphthalate-based resin, a fluorinated aromatic polymer-based resin, a (modified) acrylic resin, an epoxy-based resin, a curable allyl ester-based resin, an ultraviolet-curable silsesquioxane-based resin, an ultraviolet-curable acrylic resin, and an ultraviolet-curable vinyl-based resin.

An optical filter according to an embodiment of the present invention can be used for ambient light sensors, and an ambient light sensor including the optical filter is provided. Furthermore, an electronic device including the ambient light sensor according to an embodiment of the present invention is provided.

DESCRIPTION OF EMBODIMENTS

Figure 1A:
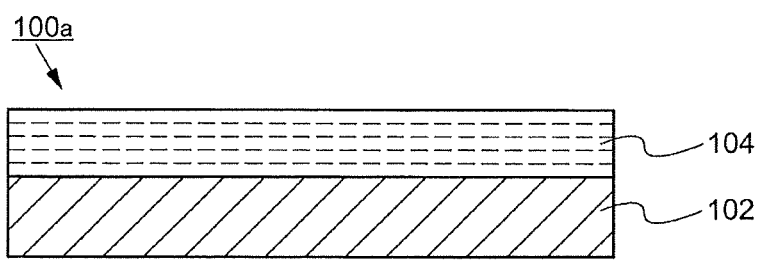
FIG. 1A, FIG. 1B, and FIG. 1C are diagrams illustrating the respective configurations of optical filters according to an embodiment of the present invention.

Embodiments of the present invention will be described with reference to the drawings. It should be noted that the present invention can be realized in various modified embodiments, and should not be interpreted as being limited to description of the embodiments exemplified below. To make the description more clearly, the width, thickness, form, and the like of each part in the drawings are sometimes schematically expressed, compared with those in an actual embodiment, but, are only examples and not intended to limit the interpretation of the present invention. Furthermore, in the specification and the drawings, the same parts as ones already described in the foregoing drawings are denoted by the same reference numerals or denoted by similar reference numerals (reference numerals each formed by appending only a, b, or the like as a suffix to a numeral), and sometimes, detailed descriptions thereof will be suitably omitted.

1. Optical Filter

An optical filter according to an embodiment of the present invention includes a base member having a layer containing near-infrared absorbing fine particles and a dielectric multilayer film provided on at least one side of the base member. The dielectric multilayer film is provided on at least one side of the base member. The optical filter according to the embodiment of the present invention has a high visible-light transmittance and near-infrared blocking performance for both light incident from a direction perpendicular to the optical filter and light incident from a direction oblique thereto (in particular, incident light at a high incident angle).

It should be noted that, in the specification, light perpendicularly incident on the base member constituting the optical filter is defined as perpendicularly incident light, and, taking the perpendicularly incident light as a reference incident light (an incident angle of 0 degrees), light obliquely incident on the base member is defined as obliquely incident light.

The optical filter according to the embodiment of the present invention satisfies the following requirements (a) and (b).

(a) In a wavelength range of 400 nm to 650 nm, the average of transmittance (hereinafter, also referred to as "average transmittance") of any of light incident from a direction perpendicular to the base member, light obliquely incident at an angle of 30 degrees with respect to the perpendicular direction, and light obliquely incident at an angle of 60 degrees with respect to the perpendicular direction is 45% or higher and lower than 85%.

This average is preferably 48% or higher, more preferably 52% or higher, and still more preferably 55% or higher. When, in the above-mentioned wavelength range, the average transmittance at any of the incident angles is in this average transmittance range, in the case where the optical filter according to the embodiment of the present invention is used for an ambient light sensor, excellent sensor sensitivity can be attained. By contrast, when the average transmittance of the optical filter at each of the above-mentioned incident angles in a wavelength range of 400 nm to 650 nm is 85% or higher, an upper limit to the amount of the near-infrared absorbing fine particles added occurs, and accordingly, it tends to be difficult to achieve both sufficient near-infrared blocking performance and excellent sensor sensitivity. The average transmittance of the optical filter at each of the incident angles in a wavelength range of 400 nm to 650 nm is preferably lower than 83%, more preferably lower than 80%, and still more preferably lower than 75%.

(b) In a wavelength range of 800 nm to 1,200 nm, the average of the optical density (OD values) (hereinafter, also referred to as an "average optical density") of any of light incident a direction perpendicular to the base member, light obliquely incident at an angle of 30 degrees with respect to the perpendicular direction, and light obliquely incident at an angle of 60 degrees with respect to the perpendicular direction is 1.7 or higher. This average is preferably 1.8 or higher, more preferably 1.9 or higher, still more preferably 2.0 or higher, and particularly still more preferably 2.1 or higher. The upper limit of the optical density is not limited to a particular value, but, is preferably 6.0 or lower, and more preferably 5.5 or lower. An extremely high optical density tends to cause a decrease in transmittance in the visible range, and furthermore, leads to the disappearance of a remarkable difference in practicality, and hence, in the case where the optical filter is used for ambient light sensors, the upper limit of the optical density is preferably set to be in the above-mentioned range. When, in that wavelength range, the average of the optical density at any of the incident angles is in this optical density range, in the case where the optical filter according to the embodiment of the present invention is used for ambient light sensors, a sensor malfunction can be prevented.

It should be noted that the optical density represents a property of blocking the light at a specific wavelength by reflection or absorption, and can be determined by the equation: optical density=$\log_{10}$ (100/T), where the amount of incident light is 100; and the amount of transmitted light is T. For example, when the transmittance of the optical filter at a specific wavelength is 0.8% (the transmittance including interface reflection loss), the optical density at this wavelength is $\log_{10}$ (100/0.8)=2.10. Furthermore, the "average" of the optical density (OD values) denotes an average in the entire wavelength range of 800 nm to 1200 nm.

Furthermore, the optical filter according to the embodiment of the present invention preferably satisfies the requirement (c).

(c) In a wavelength range of 400 nm to 650 nm, the average of transmittance of light obliquely incident at an angle of 30 degrees with respect to a direction perpendicular to the base member is higher than the average of transmittance of light incident from the direction perpendicular to the base member and light obliquely incident at an angle of 60 degrees with respect to the perpendicular direction. In such case, a decrease in the visible light transmittance of light obliquely incident at an angle of 60 degrees with respect to the perpendicular direction tends to be suppressed (owing to the properties of a dielectric multilayer film, an incident angle of 60 degrees or higher sometimes causes an extreme decrease in visible light transmittance and in the case where the optical filter is used for ambient light sensors, variation in sensor sensitivity due to incidence angles of light can be reduced.

When the above-mentioned requirement is satisfied in this wavelength range, in the case where the optical filter according to the embodiment of the present invention is used for ambient light sensors, a sensor malfunction can be prevented.

Furthermore, the optical filter according to the embodiment of the present invention preferably satisfies requirements (d), (e), and (f).

(d) In a wavelength range of 430 nm to 470 nm, the average of transmittance of any of light incident from a direction perpendicular to the base member, light obliquely incident at an angle of 30 degrees with respect to the perpendicular direction, and light obliquely incident at an angle of 60 degrees with respect to the perpendicular direction is 45% or higher. This average is preferably 48% or higher, and more preferably 50% or higher. The upper limit of the average transmittance is not limited to a particular value, but, is preferably 85% or lower.

(e) In a wavelength range of 520 nm to 560 nm, the average of transmittance of any of light incident from a direction perpendicular to the base member, light obliquely incident at an angle of 30 degrees with respect to the perpendicular direction, and light obliquely incident at an angle of 60 degrees with respect to the perpendicular direction is 60% or higher. This average is preferably 62% or higher, and more preferably 65% or higher. The upper limit of the average transmittance is not limited to a particular value, but, is preferably 88% or lower.

(f) In a wavelength range of 580 nm to 620 nm, the average of transmittance of any of light incident from a direction perpendicular to the base member, light obliquely incident at an angle of 30 degrees with respect to the perpendicular direction, and light obliquely incident at an angle of 60 degrees with respect to the perpendicular direction is 50% or higher. This average is preferably 53% or higher, and more preferably 55% or higher. The upper limit of the average transmittance is not limited to a particular value, but, is preferably 85% or lower.

It is preferable to satisfy the above-mentioned requirements (d), (e), and (f) because such satisfaction leads to a good visible light transmittance of even obliquely-incident light in wavelength ranges corresponding to blue, green, and red, and accordingly, in the case where the optical filter according to the embodiment of the present invention is used for ambient light sensors, good color-tone sensing properties can be achieved, independently of incident angles of light.

Figure 1B:
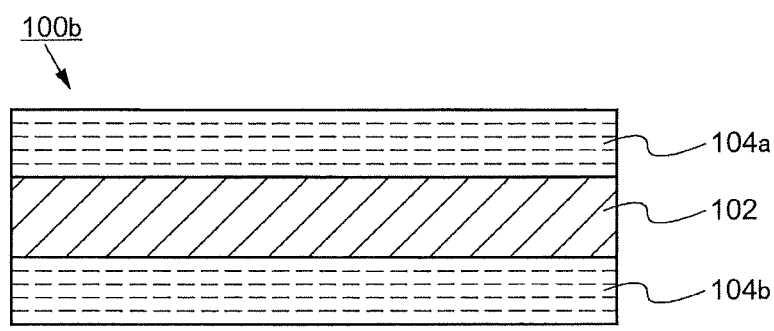
Figure 1C:
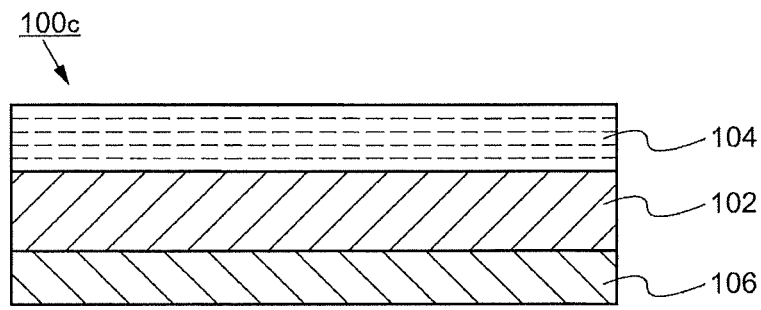

FIG. 1A, FIG. 1B, and FIG. 1C illustrate optical filters according to the embodiment of the present invention. An optical filter 100a illustrated in FIG. 1A has a dielectric multilayer film 104 on at least one side of a base member 102. The dielectric multilayer film 104 has the property of reflecting near-infrared rays. FIG. 1B illustrates an optical filter 100b provided with a first dielectric multilayer film 104a on one side of a base member 102 and provided with a second dielectric multilayer film 104b on the other side of the base member 102. As mentioned above, a dielectric multilayer film that reflects near-infrared rays may be provided on one side of a base member, or may be provided on both sides thereof. In the case where a dielectric multilayer film is provided on one side of the base member, an optical filter excellent in production cost and ease of production can be achieved. By contrast, in the case where a dielectric multilayer film is provided on both sides of the base member, an optical filter that has high strength and is unlikely to be warped or twisted can be achieved. In the case where an optical filter is applied to an ambient light sensor, a dielectric multilayer film is preferably provided on both sides of the base member because it is preferable that the optical filter is less warped and less twisted.

In addition to allowing the penetration of light having a wavelength corresponding to visible light, the dielectric multilayer film 104 has the property of reflecting light incident from a direction perpendicular to the film preferably over an entire wavelength range of 800 nm to 1,150 nm, more preferably over an entire wavelength range of 800 nm to 1,200 nm, and still more preferably over an entire wavelength range of 800 nm to 1,250 nm. An embodiment example in which a dielectric multilayer film is provided on both sides of a base member 102 is such that a first dielectric multilayer film 104a having the reflection property mainly around a wavelength range of 800 nm to 1,000 nm when measured at an angle of 5 degrees with respect to a direction perpendicular to an optical filter (or the base member) is provided on one side of the base member 102, and a second dielectric multilayer film 104b having the reflection property mainly around a wavelength range of 1,000 nm to 1,250 nm when measured at an angle of 5 degrees with respect to the direction perpendicular to the optical filter (or the base member) is provided on the other side of the base member 102.

Furthermore, as another embodiment, an optical filter 100c illustrated in FIG. 1C can be mentioned in which a dielectric multilayer film 104 having the reflection property mainly around a wavelength range of 800 nm to 1,250 nm when measured at an angle of 5 degrees with respect to the perpendicular direction to the optical filter is provided on one side of a base member 102, and an antireflection film 106 having the antireflection property in the visible range is provided on the other side of the base member 102. The use of a dielectric multilayer film and an antireflection film in combination for a base member allows the transmittance of light in the visible range to be increased and near-infrared rays to be reflected.

Haze required for the optical filter according to the embodiment of the present invention depends on applications. For example, in the case where the optical filter is used for ambient light sensors, the haze is preferably 8% or less, more preferably 5% or less, and still more preferably 3% or less. When the haze is larger than 8%, sensor sensitivity sometimes decreases.

The thickness of the optical filter may be suitably selected in accordance with a desired use, but, in terms of the recent trend toward the slimming down and weight reduction of information terminal devices, the thickness is preferably smaller.

The thickness of the optical filter according to the embodiment of the present invention is preferably 210 μm or less, more preferably 190 μm or less, still more preferably 160 μm or less, and particularly still more preferably 130 μm or less. The lower limit of the thickness is not limited to a particular value, but, in terms of the strength and ease of handling of the optical filter, the thickness is preferably 20 μm, for example.

2. Base Member

Figure 2A:
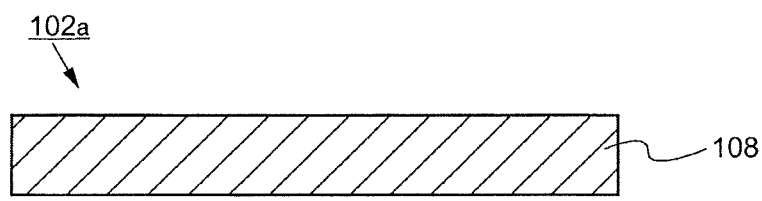
FIG. 2A, FIG. 2B, and FIG. 2C are diagrams illustrating the respective configurations of optical filters according to an embodiment of the present invention.
Figure 2B:
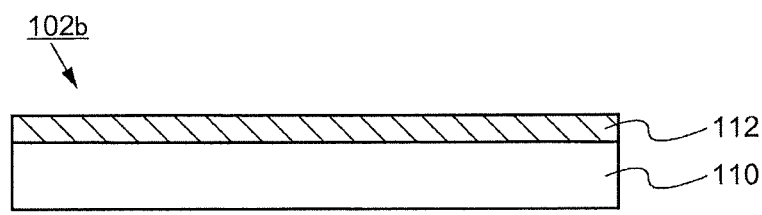
Figure 2C:
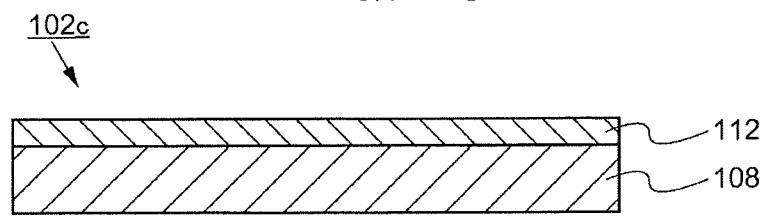

FIG. 2A, FIG. 2B, and FIG. 2C illustrate the configurations of a base member 102. The base member 102 may be composed of a single layer or a multilayer, and is only required to include a layer containing at least one kind of near-infrared absorbing fine particles. The layer containing the near-infrared absorbing fine particles is preferably a transparent resin layer.

Hereinafter, a layer containing a transparent resin and at least one kind of near-infrared absorbing fine particles is also referred to as a "transparent resin layer", and a resin layer other than the transparent resin layer is also simply referred to as a "resin layer."

As illustrated in FIG. 2A, a base member 102a composed of a single layer is a transparent resin substrate 108 containing near-infrared absorbing fine particles. This transparent resin substrate corresponds to the above-mentioned transparent resin layer. FIG. 2B illustrates a base member 102b having a multilayer structure. The base member 102b has a structure, for example, in which a resin layer 112, such as an overcoat layer, formed of a curing resin or thermoplastic resin containing near-infrared absorbing fine particles is laminated on a support 110, such as a glass support or a resin support. It should be noted that a layer corresponding to the resin layer 112 may be provided on both sides of the support 110. FIG. 2C illustrates a base member 102c in which a resin layer 112, such as an overcoat layer, formed of, for example, a curing resin containing near-infrared absorbing fine particles is laminated on a transparent resin substrate 108 containing near-infrared absorbing fine particles.

In the case where a base member has a glass support, to achieve both slimming down of the base member and necessary strength thereof, the glass support is preferably a colorless, transparent glass substrate containing no absorbent. In particular, when the base member has a thickness of 150 μm or less, the above is remarkably preferable (fluorophosphate glass or the like containing copper as an absorbent tends to be of lower strength). In the case where a base member has a resin support, in terms of ease of adjustment of optical properties, and furthermore, in terms of the effect of removing flaws of the resin support and the improvement of flaw-resistance of the base member, an embodiment is particularly preferable in which a resin layer, such as an overcoat layer, formed of a curing resin or a thermoplastic resin is laminated on both sides of the resin support, and at least one of the resin layers contains near-infrared absorbing fine particles.

The average transmittance of the base member in a wavelength range of 400 nm to 650 nm is preferably 55% or higher, more preferably 60% or higher, and still more preferably 65% or higher. When the base member having such transmission properties is used, an optical filter having high light transmission properties in a wavelength range necessary for ambient light sensors can be obtained, and thus a high sensitivity sensing function can be achieved.

The average transmittance of the base member in a wavelength range of 800 nm to 1200 nm is preferably 20% or lower, more preferably 18% or lower, and still more preferably 15% or lower. When the base member having such absorption properties is used, the use thereof in combination with a dielectric multilayer film having specific reflection properties allows an optical filter excellent in near-infrared blocking properties, independently of incident angles, to be obtained, and the optical filter can be suitably used for ambient light sensors.

The thickness of the base member may be suitably selected in accordance with a desired use and is not limited to a particular value, but, the thickness is preferably suitably selected so as to achieve both necessary strength for the base member and the slimming down thereof, that is, preferably 10 μm to 200 μm, more preferably 15 μm to 180 μm, still more preferably 20 μm to 150 μm, and particularly still more preferably 25 μm to 120 μm.

When the thickness of the base member is in the above-mentioned range, an optical filter including the base member can be thinner and lighter in weight, and accordingly can be suitably put to various uses such as ambient light sensors installed in information terminal devices.

3. Near-Infrared Absorbing Fine Particles

The near-infrared absorbing fine particles are not limited to particular particles as long as the fine particles have absorption in the near-infrared wavelength range, but preferably have absorption in a wavelength of 800 nm to 1,200 nm. Examples of such near-infrared absorbing fine particles include: transparent conductive oxides, such as ITO (indium-doped tin oxide), ATO (antimony-doped tin oxide), and GZO (gallium-doped zinc oxide); and first fine particles and second fine particles that are defined below. From the viewpoint of absorption-transmission properties, the first fine particles and the second fine particles are particularly preferable.

First fine particles: an oxide represented by a general formula $A_{1/n}CuPO_4$ (where A is at least one selected from the group consisting of alkali metals, alkaline earth metals, and $NH_4$; and n is 1 when A is an alkali metal or $NH_4$, or 2 when A is an alkaline earth metal).

Second fine particles: a metal oxide represented by a general formula $M_xW_yO_z$ (where M is H, an alkali metal, an alkaline earth metal, a rare earth element, Mg, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, F, P, S, Se, Br, Te, Ti, Nb, V, Mo, Ta, Re, Be, Hf, Os, Bi, or I, and in the case where a plurality of M are contained, the plurality of M may be different atoms; W is tungsten; O is oxygen; $0.001 \leq x/y \leq 1$; and $2.2 \leq z/y \leq 3.0$).

In the present invention, the alkali metals are Li, Na, K, Rb, and Cs; the alkaline earth metals are Ca, Sr, and Ba; and the rare earth elements are Sc, Y, La, Ce, Pr, Nd, Pm, Sm, Eu, Gd, Tb, Dy, Ho, Er, Tm, Yb, and Lu.

The average particle diameter of the near-infrared absorbing fine particles is preferably 1 nm to 200 nm, that is, 200 nm or smaller, more preferably 150 nm or smaller, and still more preferably 100 nm or smaller. The particle diameter of the near-infrared absorbing fine particles is determined by measuring a suspension liquid in which the near-infrared absorbing fine particles are dispersed (hereinafter, also simply referred to as a "dispersion liquid") by a dynamic light scattering method (using He—Ne laser, cell temperature: 25° C.) using a dynamic light scattering photometer (DLS-8000 HL/HH, manufactured by Otsuka Electronics Co., Ltd.). When the average particle diameter of the near-infrared absorbing fine particles is in this range, geometric scattering and Mie scattering that cause a decrease in visible light transmittance can be reduced, and thus the particles are in the Rayleigh scattering range. In the Rayleigh scattering range, scattered light is reduced in inverse proportion to the sixth power of a particle diameter, and accordingly, with a decrease in particle diameter, dispersion is reduced and visible light transmittance is improved. Hence, the particle diameter is preferably in the above-mentioned range, because such particle diameter leads to the achievement of a great reduction in scattered light and good visible light transmittance. From the viewpoint of scattered light, the particle diameter is preferably smaller, but, in terms of ease of industrial production and production costs, the lower limit of the average particle diameter is preferably 1 nm or more, and more preferably 2 nm or more.

The content of the near-infrared absorbing particle is preferably 5 parts by weight to 60 parts by weight with respect to 100 parts by weight of a resin component constituting a layer containing the near-infrared absorbing fine particles. The upper limit of the content is more preferably 55 parts by weight, and still more preferably 50 parts by weight. The lower limit of the content is more preferably 10 parts by weight, and still more preferably 15 parts by weight. When the content of the near-infrared absorbing particles is smaller than 5 parts by weight, sometimes sufficient near-infrared absorption properties are not achieved. When the content is larger than 60 parts by weight, an increase in haze due to a decrease in visible transmittance or the aggregation of the near-infrared absorbing particles tends to be caused.

Examples of a dispersion medium for the near-infrared absorbing particles include water, alcohol, ketone, ether, ester, aldehyde, amine, aliphatic hydrocarbon, alicyclic hydrocarbon, and aromatic hydrocarbon. The dispersion mediums may be used alone, or a mixture of two or more thereof may be used. In terms of maintaining the dispersibility of the near-infrared absorbing particles, the amount of the dispersion medium is preferably 50 parts by weight to 95 parts by weight with respect to 100 parts by weight of a dispersion liquid.

A dispersing agent may be blended in the dispersion medium for the near-infrared absorption particles as necessary to improve the dispersion state of the near-infrared absorbing particles. A dispersing agent having the effect of reforming the surfaces of the near-infrared absorbing particles is used, and examples of such dispersing agent include a surfactant, a silane compound, silicone resin, a titanate-based coupling agent, an aluminum-based coupling agent, and a zircoaluminate-based coupling agent.

Examples of the surfactant include anionic surfactants (such as a special polycarboxylic acid-type high-molecular surfactant and alkyl phosphate), nonionic surfactants (such as polyoxyethylene alkyl ether, polyoxyethylene alkylphenol ether, polyoxyethylene carboxylate, and sorbitan higher carboxylate), cationic surfactants (such as polyoxyethylene alkylamine carboxylate, alkylamine, and alkylammonium salts), and amphoteric surfactants (such as higher alkylbetaine).

Examples of the silane compound include a silane coupling agent, chlorosilane, alkoxysilane, and silazane. Examples of the silane coupling agent include alkoxysilane having a functional group (such as glycidoxy group, vinyl group, amino group, alkenyl group, epoxy group, mercapto group, chloro group, ammonium group, or acryloxy group, methacryloxy group).

Examples of the silicone resin include methyl silicone resin and methylphenyl silicone resin.

Examples of the titanate-based coupling agent include titanate-based coupling agents having acyloxy group, phosphoxy group, pyrophosphoxy group, sulfoxy group, and aryloxy group.

Examples of the aluminum coupling agent include acetoalcoxyaluminum diisopropylate.

Examples of the zircoaluminate-based coupling agent include zircoaluminate-based coupling agents having amino group, mercapto group, alkyl group, and alkenyl group.

The amount of the dispersing agent is, depending on the kind of the dispersing agent, preferably 0.5 part by weight to 10 parts by weight with respect to 100 parts by weight of a dispersion liquid. A dispersing agent amount within the above-mentioned range leads to good dispersibility of the near-infrared absorbing particles, prevents a loss of transparency, and furthermore prevents the temporal precipitation of the near-infrared absorbing particles.

Examples of commercial products of the near-infrared absorbing fine particles include P-2 (ITO), manufactured by Mitsubishi Materials Corporation; Passtran (ITO), manufactured by MITSUI MINING & SMELTING CO., LTD.; T-1 (ATO), manufactured by Mitsubishi Materials Corporation; SN-100P (ATO), manufactured by ISHIHARA SANGYO KAISHA, LTD.; Pazet GK (GZO), manufactured by HakusuiTech Co., Ltd.; and YMF-02A (the second fine particles), manufactured by Sumitomo Metal Mining Co., Ltd.

3-1. First Fine Particles

The first fine particles are formed of a compound represented by the following Formula (1), and have near-infrared absorption properties originated from the crystal structure of the compound (crystallite).

$$A_{1/n}CuPO_4 \tag{1}$$

(where A is at least one selected from the group consisting of alkali metals, alkaline earth metals, and $NH_4$; and n is 1 when A is an alkali metal or $NH_4$, or 2 when A is an alkaline earth metal.)

Here, a "crystallite" means a unit crystal that can be regarded as a single crystal, and a plurality of crystallites constitutes a "particle". "A particle is formed of crystallites of a compound represented by Formula (1)" means that, for example, the crystal structure of $A_{1/n}CuPO_4$ can be observed by X-ray diffraction and the particle identified by X-ray diffraction as being substantially formed of crystallites of $A_{1/n}CuPO_4$. "A particle is substantially formed of crystallites of $A_{1/n}CuPO_4$" means that impurities may be contained to the extent that the crystallites can sufficiently maintain the crystal structure of $A_{1/n}CuPO_4$ (to the extent that the crystal structure of $A_{1/n}CuPO_4$ can be observed by X-ray diffraction). It should be noted that the X-ray diffraction measurement is performed for the near-infrared absorbing particles in powder form by making use of an X-ray diffractometer.

The reason why alkali metals (Li, Na, K, Rb, Cs), alkaline earth metals (Ca, Sr, Ba), or NH4 is adopted as A in Formula (1) will be explained in the following (i) to (iii).

(i) The crystal structure of the crystallites in the near-infrared absorbing particles is a three-dimensional mesh framework formed of $PO_4^{3-}$ and $Cu^{2+}$ alternately bonded, and the framework has a space thereinside. The size of the space conforms to each of the ionic radiuses of alkali metal ions ($Li^+$: 0.090 nm, $Na^+$: 0.116 nm, $K^+$: 0.152 nm, $Rb^+$: 0.166 nm, $Cs^+$: 0.181 nm), alkaline earth metal ions ($Ca^{2+}$: 0.114 nm, $Sr^{2+}$: 0.132 nm, $Ba^{2+}$: 0.149 nm), and $NH_4^+$ (0.166 nm), and therefore, the crystal structure can be sufficiently maintained.

(ii) Alkali metal ions, alkaline earth metal ions, and $NH_4^+$ are capable of being stable as monovalent or divalent cations in a solution, and therefore, in a production step for the near-infrared absorbing particles, at the time when a precursor is formed, the cations can be easily incorporated into the crystal structure.

(iii) There is a possibility that cations (for example, transition metal ions) that can form a strong coordinate bond with $PO_4^{3-}$ cause a crystal structure different from the crystal structure of the present embodiment that exhibits sufficient near-infrared absorption properties.

As A, K is particularly preferable, because a cation thereof has the most suitable size as an ion to be incorporated into the framework formed of $PO_4^{3-}$ and $Cu^{2+}$, and has a thermodynamically stable structure.

The crystallite sufficiently maintains the crystal structure of $A_{1/n}CuPO_4$, so that the near-infrared absorbing particles can exhibit sufficient near-infrared absorption properties. Hence, when water or a hydroxyl group adheres to the surface of the crystallite, the crystal structure of $A_{1/n}CuPO_4$ cannot be maintained, and accordingly, the difference in transmittance between light in the visible light range and light in the near-infrared wavelength range becomes smaller, and hence, the particles cannot be suitably used for the optical filter.

Hence, in the microscope IR spectra of the near-infrared absorbing particles, when the absorption peak intensity around 1000 $cm^{-1}$ that is attributable to a phosphate group is taken as a reference intensity (100%), it is preferable that the absorption peak intensity around 1600 $cm^{-1}$ that is attributable to water is 8% or less, and the absorption peak intensity around 3750 $cm^{-1}$ that is attributable to a hydroxyl group is 26% or less; and it is mote preferable that the absorption peak intensity around 1600 $cm^{-1}$ that is attributable to water is 5% or less, and the absorption peak intensity around 3750 $cm^{-1}$ that is attributable to a hydroxyl group is 15% or less. It should be noted that the microscope IR spectra are obtained by measuring the near-infrared absorbing particles in powder form by using a Fourier transform infrared spectrophotometer. Specifically, for example, using a Fourier transform infrared spectrophotometer, Magna760, manufactured by Thermo Fisher Scientific, one piece of the first fine particles is placed on a diamond plate of the spectrophotometer and made flat by a roller, followed by measurements by microscope FT-IR.

3-2. Second Fine Particles

It is known that, when the ratio of oxygen to tungsten in tungsten trioxide ($WO_3$) is reduced to 3 or less and to be in a specific composition range, free electrons are generated in the resulting tungsten oxide, thereby yielding a near-infrared absorbing material having good properties.

The composition of the tungsten to oxygen is such that the composition ratio of oxygen to tungsten is 3 or less, and furthermore, when the tungsten oxide is expressed as $W_yO_z$, preferably $2.2 \leq z/y \leq 2.999$. When the value z/y is 2.2 or more, a crystal phase of $WO_2$, which is not a target, can be prevented from appearing in the tungsten oxide, and in addition, chemical stability necessary for the material can be attained, and therefore, the oxide can be applied as an effective near-infrared absorbing material. On the other hand, when the value z/y is 2.999 or less, free electrons in necessary amounts are generated in the tungsten oxide, thereby yielding an efficient near-infrared absorbing material.

Furthermore, in tungsten oxide fine particles obtained by making the tungsten oxide into fine particles, a so-called "Magneli phase" having a composition ratio of $2.45 \leq z/y \leq 2.999$ in a general formula $W_yO_z$ is chemically stable, and exhibits good absorption properties in the near-infrared range, and therefore, the fine particles are preferable as a near-infrared absorbing material.

Furthermore, it is preferable that an element M (where M is one or a plurality of elements selected from H, alkali metals, alkaline earth metals, rare earth elements, Mg, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, F, P, S, Se, Br, Te, Ti, Nb, V, Mo, Ta, Re, Be, Hf, Os, Bi, and I) is added to the tungsten oxide to form a tungsten oxide composite, because such addition causes free electrons to be generated in the tungsten oxide composite, and absorption properties originated from the free electrons are attained in the near-infrared range, and thus, the fine particles are effective as a near-infrared absorbing material around a wavelength of 1,000 nm. In other words, the second fine particles are made of preferably a metal oxide having a composition represented by a general formula $M_xW_yO_z$ (where M is one or a plurality of the above-mentioned elements; W is tungsten; O is oxygen; $0.001 \le x/y \le 1$; and $2.2 \le z/y \le 3.0$). Here, in the tungsten oxide composite to which the element M is added, the element M is, in terms of stability, more preferably at least one element selected from alkali metals, alkaline earth metals, rare earth elements, Mg, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, F, P, S, Se, Br, Te, Ti, Nb, V, Mo, Ta, Re, Be, Hf, Os, Bi, and I; and, in terms of improving optical properties and weather resistance of the near-infrared absorbing material, the element M is still more preferably selected from alkali metals, alkali earth metal elements, transition metal elements, elements of Group 4, and elements of Group 5.

Here, when both the control of oxygen amount in the tungsten oxide composite and the addition of an element causing the generation of free electrons are used in combination, a more efficient infrared shielding material can be obtained. When the general formula of the infrared shielding material obtained by making use of both the control of oxygen amount and the addition of an element causing the generation of free electrons in combination is $M_xW_yO_z$ (where M is the above-mentioned element M; W is tungsten; and O is oxygen), a near-infrared absorbing material that satisfies relationships of $0.001 \le x/y \le 1$ and $2.2 \le z/y \le 3.0$ is preferable.

First, the value of x/y, which represents the amount of the element M added, will be explained. When the value of x/y is larger than 0.001, free electrons are generated in sufficient amounts, and thus a target infrared shielding effect can be achieved. As the amount of the element M added is larger, the amount of free electrons supplied is increased, and the infrared shielding effect is enhanced, but, the effect becomes saturated at the time when the value of x/y reaches approximately 1. By contrast, to prevent the formation of an impurity phase in the infrared shielding material, the value of x/y is preferably smaller than 1, and more preferably 0.2 or larger and 0.5 or smaller. The element M is preferably at least one selected from H, alkali metals, alkaline earth metals, rare earth elements, Mg, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, F, P, S, Se, Br, Te, Ti, Nb, V, Mo, Ta, Re, Be, Hf, Os, Bi, and I. Here, in the $M_xW_yO_z$ to which the element M is added, the element M is, in terms of stability, more preferably at least one element selected from alkali metals, alkaline earth metals, rare earth elements, Mg, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, F, P, S, Se, Br, Te, Ti, Nb, V, Mo, Ta, and Re; and, in terms of improving optical properties and weather resistance of the near-infrared absorbing material, the element M is still more preferably selected from alkali metals, alkali earth metal elements, transition metal elements, elements of Group 4, and elements of Group 5.

Next, the value of z/y, which represents the control of the amount of oxygen, will be explained. The value of z/y preferably satisfies $2.2 \le z/y \le 3.0$ because, also in the near-infrared absorbing material represented by $M_xW_yO_z$, the same mechanism as that in the above-mentioned near-infrared absorbing material represented by $W_yO_z$ works, and in addition, even when z/y=3.0, free electrons are supplied in amounts corresponding to the amount of the element M added.

3-3. Transparent Resin

The transparent resin substrate and the transparent resin layer laminated on the resin support or the glass support can be formed using a transparent resin. The transparent resin for the base member may be used alone, or two or more thereof may be used in combination.

The transparent resin is not limited to a particular resin as long as the resin does not impair the effect of the present invention, but, to ensure heat stability and moldability into a film and produce a film capable of forming a dielectric multilayer film through high-temperature deposition at a deposition temperature of 100° C. or higher, there can be mentioned, for example, a resin having a glass transition temperature (Tg) of preferably 110° C. to 380° C., more preferably 110° C. to 370° C., and still more preferably 120° C. to 360° C. Furthermore, a resin having a glass transition temperature of 140° C. or higher is particularly preferable because such resin yields a film capable of forming a dielectric multilayer film by deposition at a higher temperature.

As the transparent resin, use may be made of a resin being such that, when a resin plate made of the resin and having a thickness of 0.1 mm is formed, the resin plate has a total light transmittance (JIS (Japanese Industrial Standard) K7105) of preferably 75% to 95%, more preferably 78% to 95%, and still more preferably 80% to 95%. When a resin that leads to a total light transmittance in such range is used, the resulting substrate exhibits good transparency as an optical film.

The weight-average molecular weight (Mw) of the transparent resin measured by gel permeation chromatography (GPC) in terms of polystyrene is normally 15,000 to 350,000, and preferably 30,000 to 250,000; and the number-average molecular weight (Mn) thereof is normally 10,000 to 150,000, and preferably 20,000 to 100,000.

Examples of the transparent resin include a cyclic (poly)olefin-based resin, an aromatic polyether-based resin, a polyimide-based resin, a fluorene polycarbonate-based resin, a fluorene polyester-based resin, a polycarbonate-based resin, a polyamide-based (aramid-based) resin, a polyarylate-based resin, a polysulfone-based resin, a polyether sulfone-based resin, a polyparaphenylene-based resin, a polyimide-imide-based resin, a polyethylene naphthalate (PEN)-based resin, a fluorinated aromatic polymer-based resin, a (modified) acrylic resin, an epoxy-based resin, a curable allyl ester-based resin, an ultraviolet-curable silsesquioxane-based resin, an ultraviolet-curable acrylic resin, and an ultraviolet-curable vinyl-based resin.

3-3-1. Cyclic (Poly)Olefin-Based Resin

As the cyclic (poly)olefin-based resin, preferable are a resin obtained from at least one monomer selected from the group consisting of monomers represented by the following Formula (2) and monomers represented by the following Formula (3), and a resin obtained by further hydrogenating the above-obtained resin.

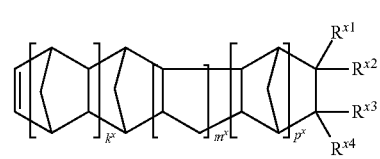

(2)

In Formula (2), $R^{x1}$ to $R^{x4}$ are each independently an atom or group selected from the following (i') to (ix'); and $k^x$, $m^x$ and $p^x$ are each independently 0 or a positive integer.

(i') a hydrogen atom (ii') a halogen atom (iii') a trialkylsilyl group (iv') a substituted or unsubstituted $C_{1-30}$ hydrocarbon group having a linking group containing an oxygen atom, a sulfur atom, a nitrogen atom, or a silicon atom (v') a substituted or unsubstituted $C_{1-30}$ hydrocarbon group (vi') a polar group (excluding (iv'))

(vii') an alkylidene group formed by a mutual bond between $R^{x1}$ and $R^{x2}$ or between $R^{x3}$ and $R^{x4}$ (where $R^{x1}$ to $R^{x4}$ that are not involved in the bond are each independently an atom or group selected from the above-mentioned (i') to (vi'))

(viii') a monocyclic or polycyclic hydrocarbon ring or heterocyclic ring formed by a mutual bond between $R^{x1}$ and $R^{x2}$ or between $R^{x3}$ and $R^{x4}$ (where $R^{x1}$ to $R^{x4}$ that are not involved in the bond are each independently an atom or group selected from the above-mentioned (i') to (vi'))

(ix') a monocyclic hydrocarbon ring or heterocyclic ring formed by a mutual bond between $R^{x2}$ and $R^{x3}$ (where $R^{x1}$ and $R^{x4}$ which are not involved in the bond are each independently an atom or group selected from the above-mentioned (i') to (vi'))

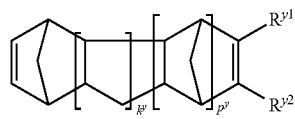

(3)

In Formula (3), $R^{y1}$ and $R^{y2}$ are each independently an atom or group selected from the above-mentioned (i') to (vi'), or a monocyclic or polycyclic alicyclic hydrocarbon, aromatic hydrocarbon, or heterocyclic ring formed by a mutual bond between $R^{y1}$ and $R^{y2}$; and $k^y$ and $p^y$ are each independently 0 or a positive integer.

3-3-2. Aromatic Polyether-Based Resin

The aromatic polyether-based resin preferably has at least one structural unit selected from the group consisting of structural units represented by the following Formula (4) and structural units represented by the following Formula (5).

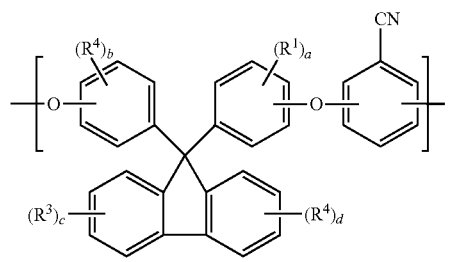

(4)

In Formula (4), $R^1$ to $R^4$ are each independently a $C_{1-12}$ monovalent organic group; and a to d are each independently an integer of 0 to 4.

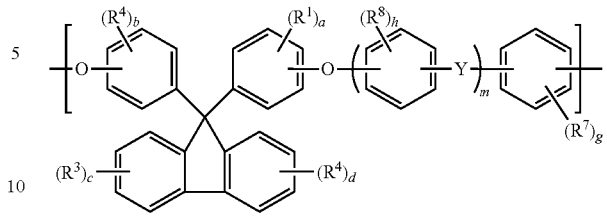

(5)

In Formula (5), $R^1$ to $R^4$ and a to d represent the same as $R^1$ to $R^4$ and a to d in Formula (4), respectively; Y is a single bond, —$SO_2$— or >C=O; $R^7$ and $R^8$ are each independently a halogen atom, a $C_{1-12}$ monovalent organic group, or a nitro group; g and h are each independently an integer of 0 to 4; and m is 0 or 1, in which, when m is 0, $R^7$ is not a cyano group.

Furthermore, the aromatic polyether-based resin preferably has at least one structural unit selected from the group consisting of structural units represented by the following Formula (6) and structural units represented by the following Formula (7).

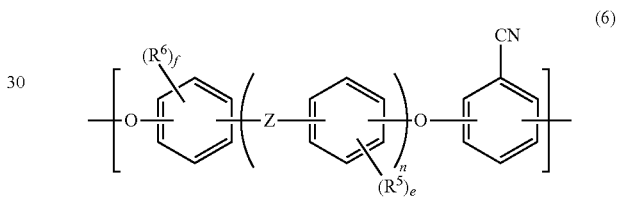

(6)

In Formula (6), $R^5$ and $R^6$ are each independently a $C_{1-12}$ monovalent organic group; Z is a single bond, —O—, —S—, —$SO_2$—, >C=O, —CONH—, —COO— or a $C_{1-12}$ divalent organic group; e and f are each independently an integer of 0 to 4; and n is 0 or 1.

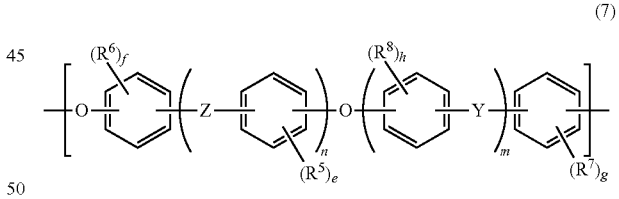

(7)

In Formula (7), $R^7$, $R^8$, Y, m, g and h represent the same as $R^7$, $R^8$, Y, m, g and h in Formula (5), respectively; and $R^5$, $R^6$, Z, n, e and f represent the same as $R^5$, $R^6$, Z, n, e and f in Formula (6), respectively.

3-3-3. Polyimide-Based Resin

The polyimide-based resin is not limited to a particular resin, and is only required to be a high-molecular compound having an imide bond in a repeating unit. The polyimide-based resin can be synthesized, for example, by a process described in Japanese Unexamined Patent Application Publication No. 2006-199945 or Japanese Unexamined Patent Application Publication No. 2008-163107.

3-3-4. Fluorene Polycarbonate-Based Resin

The fluorene polycarbonate-based resin is not limited to a particular resin, and is only required to be a polycarbonate resin containing a fluorene moiety. The fluorene polycarbonate-based resin can be synthesized, for example, by a process described in Japanese Unexamined Patent Application Publication No. 2008-163194.

3-3-5. Fluorene Polyester-Based Resin

The fluorene polyester-based resin is not limited to a particular resin, and is only required to be a polyester resin containing a fluorene moiety. The fluorene polyester-based resin can be synthesized, for example, by a process described in Japanese Unexamined Patent Application Publication No. 2010-285505 or Japanese Unexamined Patent Application Publication No. 2011-197450.

3-3-6. Fluorinated Aromatic Polymer-Based Resin

The fluorinated aromatic polymer-based resin is not limited to a particular resin, but, is preferably a polymer containing: an aromatic ring having at least one fluorine atom; and a repeating unit having at least one bond selected from the group consisting of an ether bond, a ketone bond, a sulfone bond, an amide bond, an imide bond, and an ester bond. The fluorinated aromatic polymer-based resin can be synthesized, for example, by a process described in Japanese Unexamined Patent Application Publication No. 2008-181121.

3-3-7. Ultraviolet-Curable Acrylic Resin

The ultraviolet-curable acrylic resin is not limited to a particular resin, and examples thereof include an ultraviolet-curable acrylic resin synthesized from a compound having at least one acrylic group or methacrylic group in a molecule and a resin composition containing a compound capable of being decomposed by ultraviolet rays to generate an active radical. In the case of using, as the above-mentioned base member (i), a base member in which a transparent resin layer containing the near-infrared absorbing fine particles is laminated on a glass support or a base-resin support, or a base member in which a resin layer, such as an overcoat layer, formed of a curable resin is laminated on a transparent resin substrate (ii) containing the near-infrared absorbing fine particles, the ultraviolet-curable acrylic resin can be particularly suitably used as the curable resin.

3-3-8. Epoxy-Based Resin

The epoxy-based resin is not limited to a particular resin, and can be roughly classified into ultraviolet-curable resin and thermosetting resin. Examples of the ultraviolet-curable epoxy-based resin include an ultraviolet-curable epoxy-based resin synthesized from a compound having at least one epoxy group in a molecule and a composition containing a compound capable of generating an acid by ultraviolet rays (hereinafter, also referred to as a photoacid generator). Examples of the thermosetting epoxy-based resin include a thermosetting epoxy-based resin synthesized from a compound having at least one epoxy group in a molecule and a composition containing acid anhydride. In the case of using, as the above-mentioned base member (i), a base member in which a transparent resin layer containing the near-infrared absorbing fine particles is laminated on a glass support or a base-resin support, or a base member in which a resin layer, such as an overcoat layer, formed of a curable resin is laminated on a transparent resin substrate (ii) containing the near-infrared absorbing fine particles, the ultraviolet-curable epoxy-based resin can be particularly suitably used as the curable resin.

3-3-9. Commercial Products

Examples of commercial products of the transparent resin include the following commercial products. Examples of commercial products of the cyclic (poly)olefin-based resin include ARTON, manufactured by JSR Corporation; ZEONOR, manufactured by ZEON Corporation; APEL, manufactured by Mitsui Chemicals, Inc.; and TOPAS, manufactured by Polyplastics Co., Ltd. Examples of commercial products of the polyether sulfone-based resin include SUMIKA EXCEL PES, manufactured by Sumitomo Chemical Co., Ltd. Examples of commercial products of the polyimide-based resin include NEOPRIM L, manufactured by Mitsubishi Gas Chemical Company, Inc. Examples of commercial products of the polycarbonate-based resin include PURE-ACE, manufactured by TEIJIN Ltd. Examples of commercial products of the fluorene polycarbonate-based resin include YUPIZETA EP-5000, manufactured by Mitsubishi Gas Chemical Company, Inc. Examples of commercial products of the fluorene polyester-based resin include OKP4HT, manufactured by Osaka Gas Chemicals Co., Ltd. Examples of commercial products of the acrylic resin include ACRYVIEWA, manufactured by Nippon Shokubai Co., Ltd. Examples of commercial products of the ultraviolet-curable silsesquioxane-based resin include SIL-PLUS, manufactured by Nippon Steel Chemical Co., Ltd.

3-4. Other Components

The base member may further contain additives, such as a near-infrared absorbing dye, an antioxidant, a near-ultraviolet absorbent, a fluorescence quenching agent, and a metal complex-based compound to the extent that such additive do not impair the effects of the present invention. These other components may be used alone, or two or more thereof may be used in combination.

The near-infrared absorbing dye is preferably a solvent-soluble compound; and more preferably at least one selected from the group consisting of squarylium-based compounds, phthalocyanine-based compounds, cyanine-based compounds, naphthalocyanine-based compounds, pyrrolopyrrole-based corn pounds, croconium-based corn pounds, hexaphyrin-based compounds, metal dithiolate-based compounds, perylene-based compounds, diimonium-based dyes, and ring-expanded BODIPY (boron-dipyrromethene)-based compounds; and still more preferably contains squarylium-based compounds. The absorption maximum wavelength of the near-infrared absorbing dye is preferably 600 nm to 1,200 nm, more preferably 650 nm to 1,150 nm, and still more preferably 680 nm to 1,100 nm. When such near-infrared absorbing dye is used, both good visible light transmittance and good near-infrared absorption properties tend to be ensured, and hence, the near-infrared absorbing dye can be suitably used for the optical filter for ambient light sensors.

Examples of the near-ultraviolet absorbent include azomethine-based compounds, indole-based compounds, benzotriazole-based compounds, and triazine-based compounds.

Examples of the antioxidant include 2,6-di-t-butyl-4-methylphenol, 2,2'-dioxy-3,3'-di-t-butyl-5,5'-dimethyldiphenylmethane, tetrakis[methylene-3-(3,5-di-t-butyl-4-hydroxyphenyl)propionate]methane, and tris(2,6-di-t-butylphenyl)phosphite.

It should be noted that these additives may be mixed with a resin and the like at the time when the base member is produced, or may be added to a resin at the time when the resin is synthesized. Incidentally, the amount of the additives added is suitably determined in accordance with desired properties, normally 0.01 part by weight to 5.0 parts by weight, and more preferably 0.05 part by weight to 2.0 parts by weight with respect to 100 parts by weight of the resin.

3-5. Production Process for Base Member

In the case where the base member is a base member including a transparent resin substrate, the transparent resin substrate can be formed by, for example, melt molding or cast molding, and if necessary, coating of the molded substrate with a coating agent, such as an antireflection agent, a hard coating agent and/or an antistatic agent, is performed after the molding, whereby a base member having an overcoat layer laminated therein can be produced.

In the case where the base member is a base member in which a transparent resin layer, such as an overcoat layer, formed of a curable resin containing the near-infrared absorbing fine particles is laminated on a glass support or a base-resin support, for example, a resin solution containing the near-infrared absorbing fine particles is melt-molded or cast-molded on a glass support or a base-resin support, preferably the resin solution is applied to the support by spin coating, slit coating, or inkjet printing, or the like, and then a solvent is dried to be removed, and furthermore, light irradiation or heating is performed as necessary, whereby a base member in which a transparent resin layer is formed on a glass support or a base-resin support can be produced.

3-5-1. Melt Molding

Specific examples of the melt molding include: a process of melt-molding a pellet obtained by melt-kneading a resin and the near-infrared absorbing fine particles; a process of melt-molding a resin composition containing a resin and the near-infrared absorbing fine particles; a process of melt-molding a pellet obtained by removing a solvent from a resin composition containing the near-infrared absorbing fine particles, a resin and the solvent. Examples of a method of the melt molding include injection molding, melt extrusion molding, and blow molding.

3-5-2. Cast Molding

Examples of the cast molding include: a process in which a resin composition containing the near-infrared absorbing fine particles, a resin and a solvent is cast onto an appropriate support, and subsequently, the solvent is removed; and a process in which a curable composition containing the near-infrared absorbing fine particles, a photocurable resin and/or a thermosetting resin is cast onto an appropriate support, and a solvent is removed, and then, the resulting curable composition is cured by an appropriate means, such as ultraviolet irradiation or heating.

In the case where the base member is a base member formed of a transparent resin substrate containing the near-infrared absorbing fine particles, the base member can be obtained by peeling a coating film from a support for molding after cast molding. Alternatively, in the case where the base member is a base member in which a transparent resin layer, such as an overcoat layer, formed of a thermosetting resin or the like containing the near-infrared absorbing fine particles is laminated on a support, such as a glass support or a base-resin support, the base member can be obtained without peeling off a coating film after cast molding.

4. Dielectric Multilayer Film

Examples of the dielectric multilayer film include a dielectric multilayer film in which high-refractive index material layers and low-refractive index material layers are alternately laminated. As a material constituting the high-refractive index material layer, a material having a refractive index of 1.7 or higher may be used, and furthermore, a material having a refractive index in a range of 1.7 to 2.5 is normally selected. Examples of such material include a material that contains titanium oxide, zirconium oxide, tantalum pentoxide, niobium pentoxide, lanthanum oxide, yttrium oxide, zinc oxide, zinc sulfide, or indium oxide as a main component, and contains titanium oxide, tin oxide, and/or cerium oxide in small amounts (for example, 0% to 10% by weight with respect to the main component).

As a material constituting the low-refractive index material layers, a material having a refractive index of 1.6 or lower may be used, and furthermore, a material having a refractive index in a range of 1.2 to 1.6 is normally selected. Examples of such material include silica, alumina, lanthanum fluoride, magnesium fluoride, and sodium hexafluoroaluminate.

The method for laminating the high-refractive index material layers and the low-refractive index material layers is not limited to a particular method as long as the method forms a dielectric multilayer film in which these material layers are laminated. For example, by CVD, sputtering, vacuum-deposition, ion-assisted vapor-deposition, or ion-plating, a dielectric multilayer film having the high-refractive index material layers and the low-refractive index material layers alternately laminated therein can be formed directly on the base member.

Each of the high-refractive index material layers and the low-refractive index material layers normally preferably has a thickness of $0.1\lambda$ to $0.5\lambda$ when the wavelength of near-infrared rays to be blocked is taken as $\lambda$ (nm). The value of $\lambda$ (nm) is, for example, 700 nm to 1,400 nm, and preferably 750 nm to 1,300 nm. When the thicknesses of the layers are in this range, an optical film thickness obtained as the product of refractive index (n) and film thickness (d) (n×d) which is calculated using $\lambda/4$ is approximately the same as the thickness of each of the high-refractive index material layers and the low-refractive index material layers, so that blockage and transmission of a specific wavelength of light tends to become easily controllable in accordance with the relationships in the optical properties of reflection and refraction.

The total number of the high-refractive index material layers and the low-refractive index material layers in the dielectric multilayer film is preferably 16 to 70 layers, and more preferably 20 to 60 layers in the whole of the optical filter. When the thickness of each of the layers, and the thickness of the dielectric multilayer film and the total number of the laminated layers in the dielectric multilayer film in the whole of the optical filter are each in the above-mentioned ranges, a sufficient production margin can be ensured, and in addition, warpage of the optical filter and cracks in the dielectric multilayer film can be reduced.

In the embodiment of the present invention, the kinds of materials constituting the high-refractive index material layers and the low-refractive index material layers, and the thickness of each layer of, the lamination order of, and the lamination number of the high-refractive index material layers and the low-refractive index material layers are appropriately selected according to the absorption properties of the near-infrared absorbing fine particles, whereby, with a sufficient transmittance ensured in the visible range, sufficient light blocking properties in the near-infrared wavelength range can be ensured, and furthermore, a reduction in reflectance at the time of oblique incidence of near-infrared rays can be achieved.

Here, to optimize conditions, for example, using optical thin film design software (for example, Essential Macleod, manufactured by Thin Film Center Inc.), parameters are set so that both good visible light transmittance and light blocking effects in the near-infrared range can be achieved in any of the case of a measurement in a direction perpendicular to the optical filter (or base member), the case of a measurement at an angle of 30 degrees with respect to the perpendicular direction, and the case of a measurement at an angle of 60 degrees with respect to the perpendicular direction. In particular, for suitable use as an optical filter for ambient light sensors, it is important that changes in visible light transmittance and near-infrared blocking performance between each of the incident angles are small. To achieve such properties, the dielectric multilayer film is designed so that an incident angle at which optical properties are optimized is preferably changed in accordance with the wavelength range (for example, transmittance at a wavelength of 400 nm to 750 nm is such that optical properties are optimized at an incident angle of 30 degrees, or transmittance at a wavelength of 800 nm to 1200 nm is such that optical properties are optimized at an incident angle of 0 degrees). In the case of using the above-mentioned software, for example, when a dielectric multilayer film formed only on one side of the base member is designed, parameters are set so that a target transmittance is 100% and a target tolerance is 1 when measured at an angle of 30 degrees with respect to the perpendicular direction at a wavelength of 400 nm to 750 nm; a target transmittance is 100% and a target tolerance is 0.8 when measured in the perpendicular direction at a wavelength of 755 nm to 790 nm; a target transmittance is 0% and a target tolerance is 0.5 when measured at an angle of 30 degrees with respect to the perpendicular direction at a wavelength of 800 nm to 1,000 nm; and a target transmittance is 0% and a target tolerance is 0.7 when measured at an angle of 0 degrees with respect to the perpendicular direction at a wavelength of 1,005 nm to 1,300 nm. These parameters may be set so that, according to various properties and the like of the base member (i), the wavelength range is further divided into more sections and an light incident angle at which a design is optimized and a target tolerance are changed. In particular, a design is preferably optimized for obliquely incident light in at least part of a wavelength range of 400 nm to 700 nm because, even in the case of a very large incident angle, such as an incident angle of 60 degrees, a decrease in visible transmittance due to ripples and others can be suppressed.

5. Other Functional Films

For the purpose of, for example, improving the surface hardness of the base member and the dielectric multilayer film, improving the chemical resistance, providing antistaticity, and removing flaws, the optical filter according to the embodiment of the present invention may be suitably provided with a functional film, such as an anti-reflection film, a hard coat film or an antistatic film, between the base member and the dielectric multilayer film, on a surface of the base member which surface is opposite to a surface thereof on which the dielectric multilayer film is provided, or on a surface of the dielectric multilayer film which surface is opposite to a surface thereof on which the base member is provided to the extent that such arrangement does not impair the effects of the present invention.

The optical filter according to the embodiment of the present invention may include a single layer formed of the above-described functional film, or may include two or more layers formed thereof. In the case where the optical filter according to the embodiment of the present invention includes two or more layers formed of such functional film, the two or more layers may be the same as or different from one another.

The process for laminating such functional film is not limited to a particular process, and examples thereof include a process of melt molding or cast molding a coating agent, such as an antireflection agent, a hard coating agent, and/or an antistatic agent, on the base member or the dielectric multilayer film in the same manner as previously described.

Alternatively, a functional film may be produced by applying a curable composition containing, for example, a coating agent on the base member or the dielectric multilayer film by making use of a bar coater or the like, and then curing the curable composition by ultra-violet irradiation or the like.

Examples of the coating agent include ultraviolet (UV)/electron beam (EB)-curable resins and thermosetting resins, specifically, vinyl compounds and urethane-based, urethane acrylate-based, acrylate-based, epoxy-based, and epoxy acrylate-based resins. Examples of the curable composition containing the coating agent include vinyl-based, urethane-based, urethane acrylate-based, acrylate-based, epoxy-based, and epoxy acrylate-based curable compositions.

Furthermore, the curable composition may contain a polymerization initiator. As the polymerization initiator, any known photopolymerization initiator or heat polymerization initiator may be used. Alternatively, a photopolymerization initiator and a heat polymerization initiator may be used in combination. Such polymerization initiators may be used alone, or two or more thereof may be used in combination.

The blending ratio of the polymerization initiator(s) in the curable composition is preferably 0.1% to 10% by weight, more preferably 0.5% to 10% by weight, still more preferably 1% to 5% by weight when the total amount of the curable composition is taken as 100% by weight. When the blending ratio of the polymerization initiator(s) is in the above-described range, the curable composition is excellent in curability and ease of handling, and can thus yield a functional film, such as an antireflection film, a hard coat film, or an antistatic film, that has a desired hardness.

Furthermore, to the curable composition, an organic solvent may be added as a solvent. As the organic solvent, any known organic solvent may be used. Specific examples of the organic solvent include alcohols, such as methanol, ethanol, isopropanol, butanol, and octanol; ketones, such as acetone, methyl ethyl ketone, methyl isobutyl ketone, and cyclohexanone; esters, such as ethyl acetate, butyl acetate, ethyl lactate, γ-butyrolactone, propylene glycol monomethyl ether acetate, and propylene glycol monoethyl ether acetate; ethers, such as ethylene glycol monomethyl ether and diethylene glycol monobutyl ether; aromatic hydrocarbons, such as benzene, toluene, and xylene; and amides, such as dimethylformamide, dimethylacetamide, and N-methylpyrrolidone. These solvents may be used alone, or two or more thereof may be used in combination.

The thickness of the functional film is preferably 0.1 μm to 20 μm, more preferably 0.5 μm to 10 μm, and still more preferably 0.7 μm to 5 μm.

Furthermore, for the purpose of improving the adhesion between the base member and the functional film and/or the dielectric multilayer film or the adhesion between the functional film and the dielectric multilayer film, the surface of the base member, the functional film, or the dielectric multilayer film may be subjected to surface treatment such as corona treatment or plasma treatment.

6. Uses of Optical Filter

The optical filter according to the embodiment of the present invention exhibits excellent visible transmittance and near-infrared blocking performance even in the case of a greater incident angle. Therefore, the optical filter is useful for various ambient light sensors, such as an illuminance sensor and a sensor for color correction. In particular, the optical filter is useful for ambient light sensors installed in digital still cameras, smart phones, tablet terminals, cell phones, wearable devices, vehicles, televisions, or game machines. Furthermore, the optical filter is also useful as a heat ray cut filter mounted on a glass plate for windows of vehicles, buildings, or the likes.

7. Ambient Light Sensor

A combination of the optical filter according to the embodiment of the present invention and a photoelectric conversion element can be used as an ambient light sensor. Here, the ambient light sensor is a sensor capable of sensing ambient brightness and ambient color tones (for example, a strong red during evening hours), such as an illuminance sensor or a sensor for color correction, and for example, based on information sensed by the ambient light sensor, the illuminance and color tones of a display mounted in an apparatus can be controlled.

Figure 3:
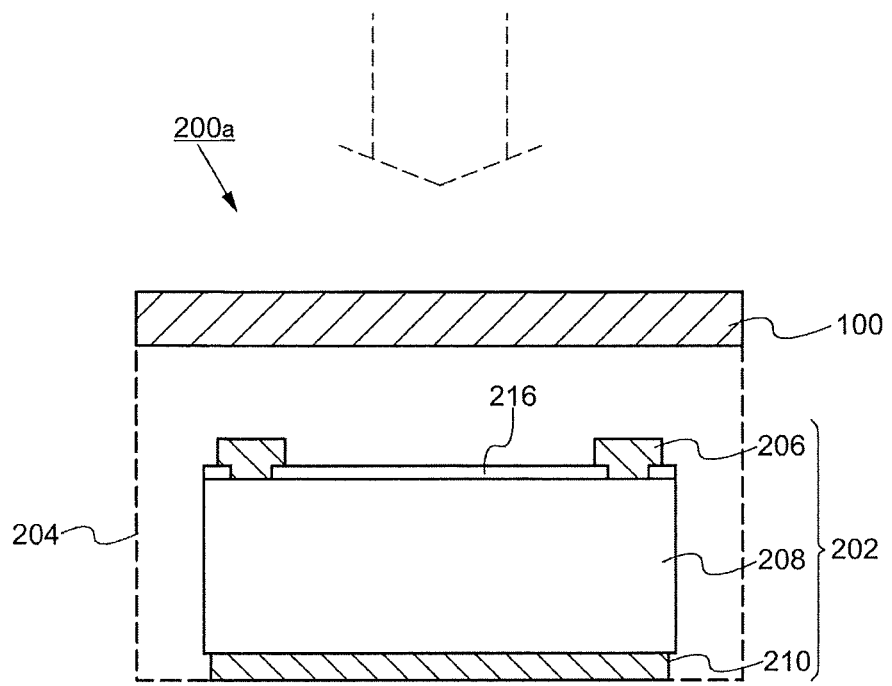
FIG. 3 is a diagram illustrating the configuration of an ambient light sensor according to an embodiment of the present invention.

FIG. 3 illustrates an example of an ambient light sensor 200a for detecting ambient brightness. The ambient light sensor 200a includes an optical filter 100 and a photoelectric conversion element 202. The photoelectric conversion element 202 generates a current and a voltage by a photovoltaic effect when light enters a light-receiving section. The optical filter 100 is provided on the light-receiving surface side of the photoelectric conversion element 202. By the optical filter 100, light that enters the light-receiving surface of the photoelectric conversion element 202 is made into light in the visible light range, and light in the near-infrared range (800 nm to 2,500 nm) is blocked. The ambient light sensor 200a senses visible light to output a signal.

It should be noted that, in the ambient light sensor 200a, another translucent layer may be provided between the optical filter 100 and the photoelectric conversion element 202. For example, a translucent resin layer serving as a sealing material may be provided between the optical filter 100 and the photoelectric conversion element 202.

The photoelectric conversion element 202 includes a first electrode 206, a photoelectric conversion layer 208, and a second electrode 210. The photoelectric conversion element 202 further include a passivation film 216 provided on the light-receiving surface side thereof. The photoelectric conversion layer 208 is formed of a semiconductor that exhibits a photoelectric effect. For example, the photoelectric conversion layer 208 is formed using a silicon semiconductor. The photoelectric conversion layer 208 is a diode element, and generates a photoelectromotive force by a built-in electric field. It should be noted that the photoelectric conversion element 202 is not limited to a diode element, but may be a photoconductive element (also called a photoresistor, a light dependent resistance, a photoconductor, or a photocell), or a phototransistor element.

Besides a silicon semiconductor, the photoelectric conversion layer 208 may be formed using a germanium semiconductor or a silicon germanium semiconductor. Furthermore, for the photoelectric conversion layer 208, compound semiconductor materials, such as GaP, GaAsP, CdS, CdTe, and $CuInSe_2$, may be used. The photoelectric conversion element 202 formed of a semiconductor material has sensitivity to light from the visible light range to the near-infrared range. For example, in the case where the photoelectric conversion layer 208 is formed of a silicon semiconductor, the silicon semiconductor has a bandgap energy of 1.12 eV, and hence, theoretically, light having a wavelength of 700 nm to 1,100 nm, that is, near-infrared rays can be absorbed. However, when provided with the optical filter 100, the ambient light sensor 200a does not sense near-infrared rays, but has sensitivity to light in the visible light range. It should be noted that the photoelectric conversion element 202 is preferably surrounded by a light-shielding housing 204 so as to be selectively irradiated with light having penetrated the optical filter 100. When provided with the optical filter 100, the ambient light sensor 200a can block near-infrared rays and detect ambient light. Thus, a trouble that, for example, the ambient light sensor 200a senses near-infrared rays and thereby malfunctions can be avoided.

Figure 4:
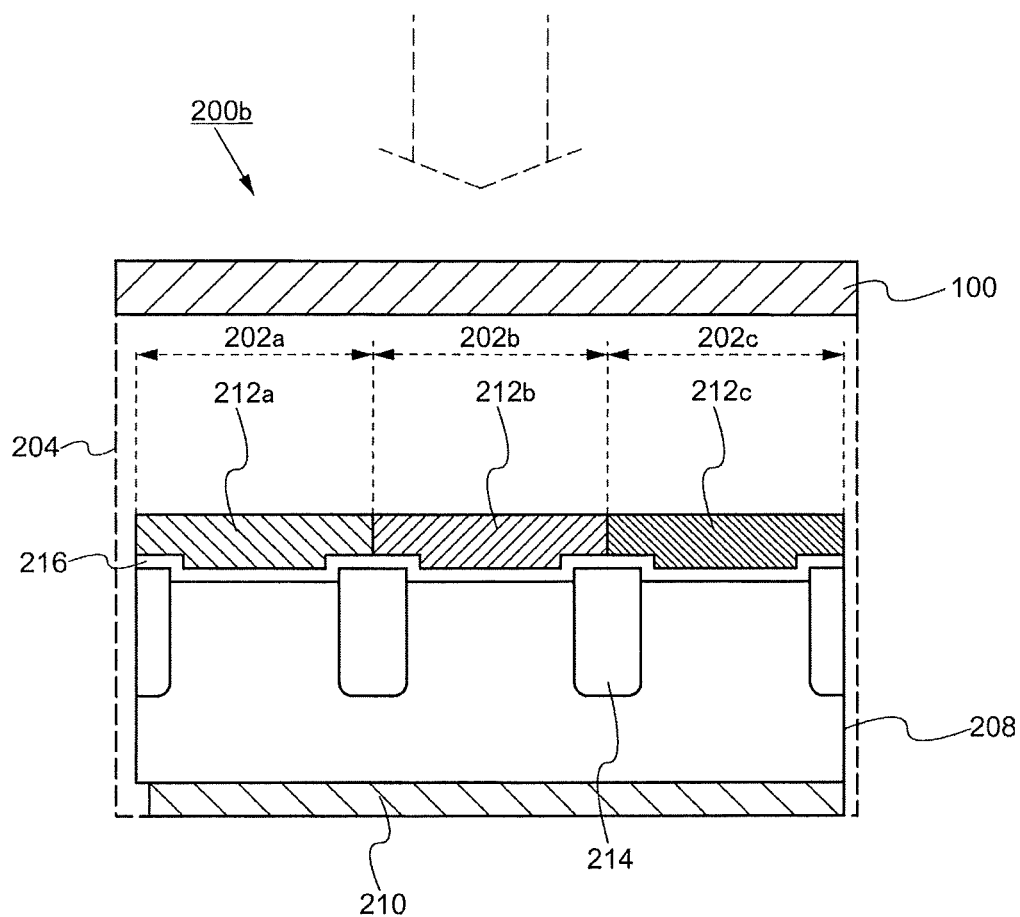
FIG. 4 is a diagram illustrating the configuration of an ambient light sensor according to an embodiment of the present invention.

FIG. 4 illustrates an example of an ambient light sensor 200b for detecting ambient color tones in addition to ambient brightness. The ambient light sensor 200b is configured to include an optical filter 100, photoelectric conversion elements 202a to 202c, and color filters 212a to 212c. The color filter 212a that penetrates light in the red light region is provided on the light-receiving surface of the photoelectric conversion element 202a; the color filter 212b that penetrates light in the green light region is provided on the light-receiving surface of the photoelectric conversion element 202b; and the color filter 212c that penetrates light in the blue light region is provided on the light-receiving surface of the photoelectric conversion element 202c. The photoelectric conversion elements 202a to 202c have the same configuration as that illustrated in FIG. 3, except that the photoelectric conversion elements 202a to 202c are insulated to each other by an element isolation insulating layer 214. This configuration allows the photoelectric conversion elements 202a to 202c to independently detect illuminance. It should be noted that a passivation film 216 may be provided between the color filters 212a to 212c and the photoelectric conversion elements 202a to 202c.

The photoelectric conversion elements 202a to 202c have sensitivity over a wide range from the visible light wavelength range to the near-infrared wavelength range. Therefore, the ambient light sensor 200b which is provided with, besides the optical filter 100, the color filters 212a to 212c corresponding to the photoelectric conversion elements 202a to 202c, respectively, are capable of detecting light corresponding to each of the colors, while blocking near-infrared rays and preventing a sensor malfunction. The ambient light sensor 200b which is provided with the optical filter 100 for blocking light in the near-infrared range and the color filters 212a to 212c not only can detect ambient light by separating the ambient light into lights in a plurality of wavelength ranges, but also can be used even under a dark environment where conventional color sensors cannot perform accurate detection due to the influence of near-infrared rays.

8. Electronic Device

Figure 5A:
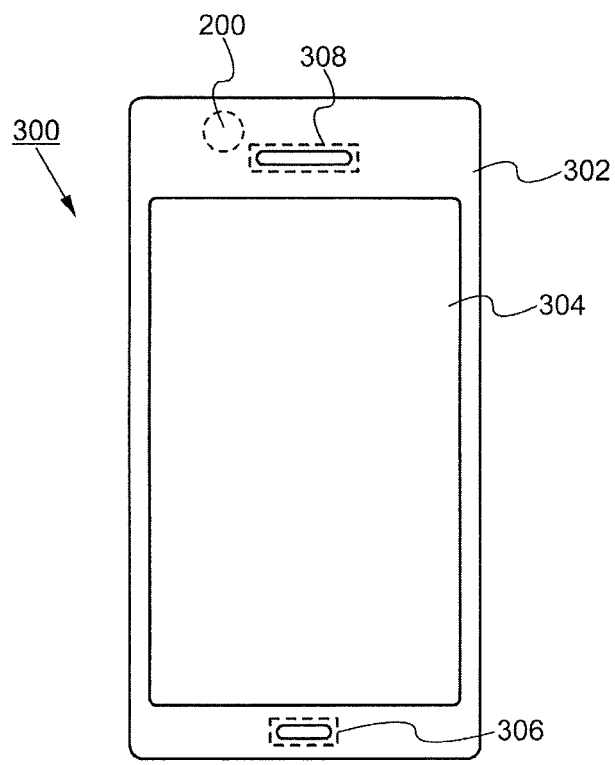
FIG. 5A, FIG. 5B, and FIG. 5C are diagrams illustrating a configuration example of an electronic device including an ambient light sensor according to an embodiment of the present invention.
Figure 5B:
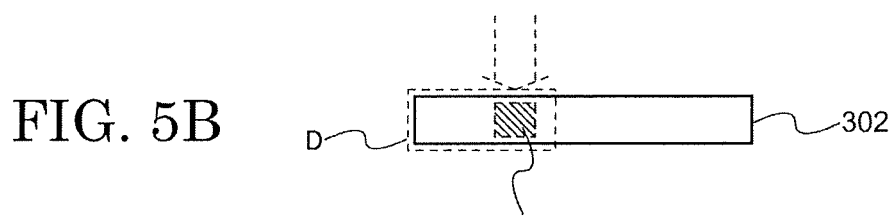
Figure 5C:
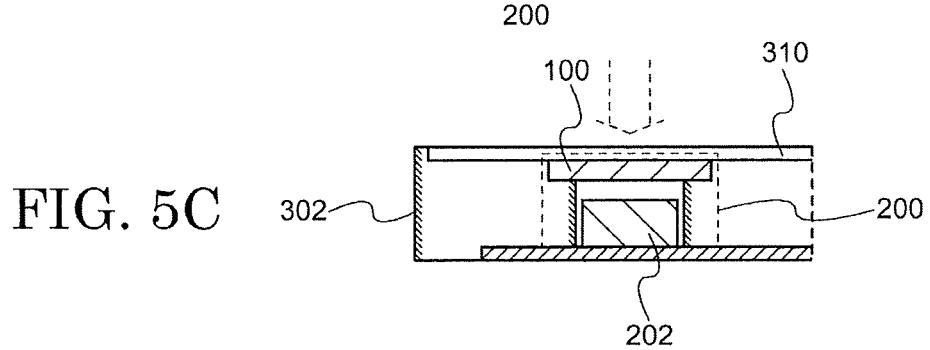

FIG. 5A, FIG. 5B, and FIG. 5C illustrate an example of an electronic device 300 having the ambient light sensor 200 according to the embodiment of the present invention. It should be noted that FIG. 5A is a front view, FIG. 5B is a top view, and FIG. 5C is a detail view illustrating the configuration of an area D surrounded by a dotted line in FIG. 5B. The electronic device 300 includes a housing 302, a display panel 304, a microphone unit 306, a speaker unit 308, and the ambient light sensor 200. A touch panel is adopted as the display panel 304, and thus the display panel 304 has both a display function and an input function.

The ambient light sensor 200 is provided in the back surface of a surface panel 310 provided in the housing 302. In other words, the ambient light sensor 200 cannot be seen in the external appearance of the electronic device 300, and light enters the ambient light sensor 200 through the translucent surface panel 310. At the surface panel 310, light in the near-infrared range is blocked by the optical filter 100, and light in the visible light range enters the photoelectric conversion element 202. The electronic device 300 is capable of controlling the illuminance and color tones of the display panel 304 by the ambient light sensor 200.

EXAMPLES

The present invention will be more specifically described with reference to the following examples, but, the present invention is not limited to the examples. It should be noted that the term "part(s)" means "part(s) by weight" unless otherwise specified. Furthermore, methods for measuring property values and methods for evaluating properties are as follows.

<Molecular Weight>

Taking into consideration, for example, the solubility of each resin in a solvent, the molecular weight of the resin was measured by the following method (a) or (b).

(a) Using a gel permeation chromatography (GPC) apparatus manufactured by Waters Corp. (Model 150C, column: H-type column manufactured by Tosoh Corporation, developing solvent: o-dichlorobenzene), the weight-average molecular weight (Mw) and the number-average molecular weight (Mn) of each resin were measured in terms of standard polystyrene.

(b) Using a GPC apparatus manufactured by Tosoh Corporation (Model HLC-8220, column: TSKgela-M, developing solvent: THF), the weight-average molecular weight (Mw) and the number-average molecular weight (Mn) of each resin were measured in terms of standard polystyrene.

It should be noted that, for a resin synthesized in the later-described Resin Synthesis Example 3, not the measurement of molecular weight by the above-described methods, but the measurement of inherent viscosity by the following method (c) was performed.

(c) A part of a polyimide resin solution was introduced into anhydrous methanol to precipitate a polyimide resin, followed by filtration to separate the resin from an unreacted monomer. Then, 0.1 g of polyimide obtained by vacuum drying the resulting resin at 80° C. for 12 hours was dissolved in 20 mL of N-methyl-2-pyrrolidone, and, using a Cannon-Fenske viscometer, the inherent viscosity (μ) at 30° C. of the solution was determined by the following formula.

$$\mu = \{ln(t_s/t_0)\}/C$$

$t_0$: flow time of solvent
$t_s$: flow time of dilute polymer solution
C: 0.5 g/dL <Glass Transition Temperature (Tg)>

Using a differential scanning calorimeter (DSC6200) manufactured by SII NanoTechnology Inc., a glass transition temperature was measured at a heating rate of 20° C. per minute under nitrogen gas flow.

<Spectral Transmittance>

The transmittance of the optical filter in each wavelength range was measured using a spectrophotometer (U-4100) manufactured by Hitachi High-Technologies Corporation.

Figure 6A:
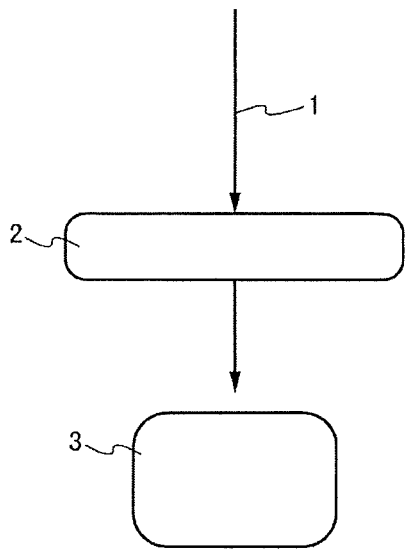
FIG. 6A is a diagram illustrating an aspect in which a transmission spectrum is measured in a perpendicular direction.
Figure 6B:
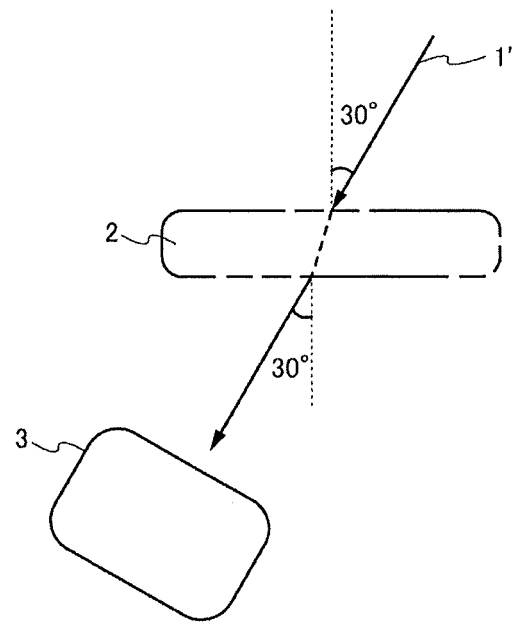
FIG. 6B is a diagram illustrating an aspect in which a transmission spectrum is measured at an oblique angle of 30 degrees.
Figure 6C:
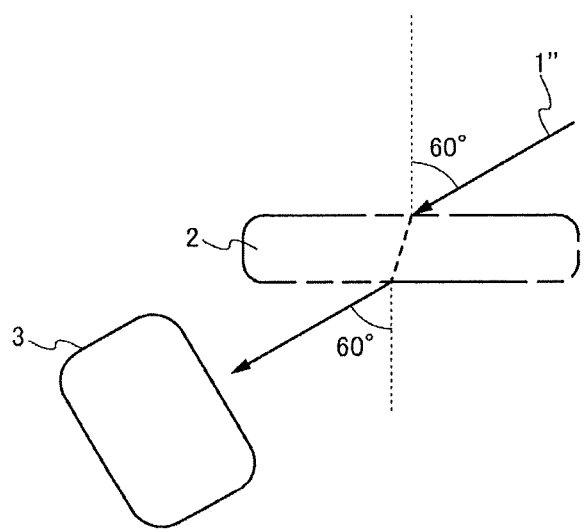
FIG. 6C is a diagram illustrating an aspect in which a transmission spectrum is measured at an oblique angle of 60 degrees.

Here, transmittance in a direction perpendicular to the optical filter was determined by measuring light 1 perpendicularly transmitting through the optical filter 2 by a spectrophotometer 3 as illustrated in FIG. 6A; transmittance at an angle of 30 degrees with respect to the perpendicular direction to the optical filter was determined by measuring light 1' transmitting through the optical filter 2 at an angle of 30 degrees with respect to the perpendicular direction by the spectrophotometer 3 as illustrated in FIG. 6B; and transmittance at an angle of 60 degrees with respect to the perpendicular direction to the optical filter was determined by measuring light 1" transmitting through the optical filter 2 at an angle of 60 degrees with respect to the perpendicular direction by the spectrophotometer 3 as illustrated in FIG. 6C.

9. Synthesis Example

Near-infrared absorbing dyes used in the following examples were synthesized by commonly known methods.

Examples of the common methods include methods described in Japanese Patent No. 3366697, Japanese Patent No. 2846091, Japanese Patent No. 2864475, Japanese Patent No. 3703869, Japanese Unexamined Patent Application Publication No. S60-228448, Japanese Unexamined Patent Application Publication No. H1-146846, Japanese Unexamined Patent Application Publication No. H1-228960, Japanese Patent No. 4081149, Japanese Unexamined Patent Application Publication No. S63-124054, "Phthalocyanines—Chemistry and Functions—" (Industrial Publishing & Consulting, Inc., 1997, p. 1-p. 29), Japanese Unexamined Patent Application Publication No. 2007-169315, Japanese Unexamined Patent Application Publication No. 2009-108267, Japanese Unexamined Patent Application Publication No. 2010-241873, Japanese Patent No. 3699464, and Japanese Patent No. 4740631.

9-1. Resin Synthesis Example 1

Into a reaction vessel purged with nitrogen, 100 parts of 8-methyl-8-methoxycarbonyl tetracyclo[4.4.0.1$^{2,5}$0.1$^{7,10}$]dodeca-3-ene represented by the following Formula (8) (hereinafter, also referred to as "DNM"), 18 parts of 1-hexene (a molecular weight modifier), and 300 parts of toluene (a solvent for ring-opening polymerization reaction) were fed, and the resulting solution was heated to 80° C. Subsequently, to the solution in the reaction vessel, as polymerization catalysts, 0.2 part of a toluene solution of triethyl aluminum (0.6 mol/L) and 0.9 part of a toluene solution of methanol-modified tungsten hexachloride (concentration: 0.025 mol/L) were added, and the resulting solution was heated and stirred at 80° C. for 3 hours to cause a ring-opening polymerization reaction, whereby a ring-opened polymer solution was obtained. The polymerization conversion ratio in this polymerization reaction was 97%.

(8)

Into an autoclave, 1,000 parts of the thus obtained ring-opened polymer solution was fed, and 0.12 part of RuHCl(CO)[P(C$_6$H$_5$)$_3$]$_3$ was added to the ring-opened polymer solution. The resulting mixture was heated and stirred for 3 hours under the conditions of a hydrogen gas pressure of 100 kg/cm$^2$ and a reaction temperature of 165° C. to perform a hydrogenation reaction. After cooling the thus obtained reaction solution (a hydrogenated polymer solution), the pressure of the hydrogen gas was released. This reaction solution was poured into a large amount of methanol, and the resulting precipitate was separated and recovered. The precipitate was then dried to obtain a hydrogenated polymer (hereinafter, also referred to as "resin A"). The thus obtained resin A had a number-average molecular weight (Mn) of 32,000, a weight-average molecular weight (Mw) of 137,000 and a glass transition temperature (Tg) of 165° C.

9-2. Resin Synthesis Example 2

Into a 3-L four-neck flask, 35.12 g (0.253 mol) of 2,6-difluorobenzonitrile, 87.60 g (0.250 mol) of 9,9-bis(4-hydroxyphenyl)fluorene, 41.46 g (0.300 mol) of potassium carbonate, 443 g of N,N-dimethylacetamide (hereinafter, also referred to as "DMAc"), and 111 g of toluene were introduced. Subsequently, the four-neck flask was fitted with a thermometer, a stirrer, a three-way cock with a nitrogen-introducing tube, a Dean-Stark tube, and a cooling tube. Then, after the flask was purged with nitrogen, the thus obtained solution underwent a reaction at 140° C. for 3 hours, and the resulting produced water was removed from the Dean-Stark tube whenever necessary. Once water was no longer produced, the temperature was slowly raised to 160° C., and the solution underwent a reaction at the same temperature of 160° C. for 6 hours. After the reaction solution was cooled down to room temperature (25° C.), the resulting produced salt was removed by a filter paper, then the resulting filtrate was introduced into methanol for reprecipitation and the resulting precipitate (residue) was isolated by filtration. The thus obtained precipitate was vacuum-dried overnight at 60° C. to obtain white powder (hereinafter, also referred to as "resin B") (yield: 95%). The thus obtained resin B had a number-average molecular weight (Mn) of 75,000, a weight-average molecular weight (Mw) of 188,000, and a glass transition temperature (Tg) of 285° C.

9-3. Resin Synthesis Example 3

Into a 500-mL five-neck flask equipped with a thermometer, a stirrer, a nitrogen-introducing tube, a dropping funnel with a side tube, a Dean-Stark tube, and a cooling tube, 27.66 g (0.08 mol) of 1,4-bis(4-amino-α, α-dimethylbenzyl) benzene and 7.38 g (0.02 mol) of 4,4'-bis(4-aminophenoxy) biphenyl were introduced under nitrogen gas flow, and dissolved in 68.65 g of γ-butyrolactone and 17.16 g of N,N-dimethylacetamide. The thus-obtained solution was cooled to 5° C. using an ice water bath, and while the solution was maintained at the same temperature of 5° C., 22.62 g (0.1 mol) of 1,2,4,5-cyclohexanetetracarboxylic dianhydride and 0.50 g (0.005 mol) of triethylamine as an imidization catalyst were added together to the solution. After the addition was completed, the temperature was raised to 180° C., and while a distillate was distilled off whenever necessary, the solution was refluxed for 6 hours. After the reaction was completed, air cooling was carried out until the internal temperature reached 100° C. Then, 143.6 g of N, N-dimethylacetamide was added to dilute the solution, and with stirring, the resulting mixture was cooled to obtain 264.16 g of a polyimide resin solution having a solids concentration of 20% by weight. A part of the polyimide resin solution was poured into 1 L of methanol to precipitate polyimide. The polyimide obtained by filtration was washed with methanol, and then dried for 24 hours in a vacuum dryer at 100° C. to obtain white powder (hereinafter, also referred to as "resin C"). When the IR spectrum of the thus obtained resin C was measured, absorption at 1704 cm$^{-1}$ and 1770 cm$^{-1}$ specific to an imide group was observed. The resin C had a glass transition temperature (Tg) of 310° C., and the inherent viscosity was measured, resulting in 0.87.

9-4. Near-Infrared Absorbing Fine Particle Production Example 1

A predetermined amount of an ammonium metatungstate solution (50 wt % in terms of WO$_3$) and a predetermined amount of a cesium chloride solution were weighed out so as to provide a W—Cs molar ratio of 1 to 0.33, and these solutions were mixed to obtain a mixed solution. This mixed solution was dried at 130° C., and used as a starting material in powder form. This starting material was heated at 550° C. for 1 hour in a reducing atmosphere (argon/hydrogen=95/5 volume ratio). Then, after the temperature was once reduced to room temperature, the material was heated at 800° C. for 1 hour in an argon atmosphere to obtain Cs$_{0.33}$WO$_3$ powder.

20 parts by weight of the Cs$_{0.33}$WO$_3$ powder, 75 parts by weight of toluene, and 5 parts by weight of a polyacrylate-based dispersing agent were mixed to be subjected to a dispersion treatment, whereby a dispersion liquid A of Cs$_{0.33}$WO$_3$ particles having an average dispersed-particle diameter of 80 nm (hereinafter, also referred to as "near-infrared absorbing fine particles (P-1)") was obtained.

9-5. Near-Infrared Absorbing Fine Particle Production Example 2

To 500 g of a 52% by mass dipotassium hydrogen phosphate solution, 500 g of a 5% by mass copper sulfate pentahydrate solution was added under stirring. The mixture was stirred at room temperature for 5 hours or longer to obtain a light-blue solution (PO$_4^{3-}$/Cu$^{2+}$ (molar ratio)=15).

A product was separated from the obtained light-blue solution by suction filtration, and the product was washed with water and acetone to obtain a light-blue product. The product was transferred to a crucible and vacuum-dried at 100° C. for 4 hours, and then, subjected to 30-second dry crushing twice using Wonder Blender (manufactured by OSAKA CHEMICAL Co., Ltd., hereinafter, manufactured by the same company).

The resulting product in powder form was transferred to a crucible, and baked at 600° C. for 8 hours under atmosphere to obtain a yellow-green baked product. The baked product was subjected to 30-second dry crushing twice using Wonder Blender. The obtained yellow-green baked product weighed 15.4 g, and the yield of the baked product was 78% on the basis of the number of moles of copper sulfate pentahydrate.

The baked product was subjected to an X-ray diffraction analysis. From the X-ray diffraction analysis results, the crystal structure of KCuPO$_4$ was confirmed, and the baked product was identified as particles substantially formed of crystallites of KCuPO$_4$.

The above-mentioned baked product was dispersed in water to form a dispersion liquid having a solids concentration of 10% by mass, and the dispersion liquid was subjected to a treatment using an ultrasonic homogenizer. Then, the dispersion liquid was subjected to wet crushing using a wet pulverizing device (Star Burst Mini, manufactured by Sugino Machine Limited). Incidentally, the number of times that the dispersion liquid passes through the diameter of an orifice was taken as the number of times of the wet crushing treatment. In the present embodiment, the number of times of the wet crushing treatment was 20 times.

By centrifugation, a crushed product was separated from the dispersion liquid after the wet crushing, and transferred into a crucible and dried at 150° C. to obtain a yellow-green crushed product. The crushed product was subjected to 30-second dry crushing twice using Wonder Blender to obtain near-infrared absorbing particles (P-2) formed of crystallites of KCuPO$_4$ and having an average particle diameter of 89 nm.

Example 1

In Example 1, an optical filter having a base member formed of a transparent resin substrate having, on both sides thereof, a resin layer containing near-infrared absorbing fine particles was produced using the following procedure and conditions.

Into a vessel, 100 parts by weight of the resin A obtained in Resin Synthesis Example 1 and methylene chloride were introduced to prepare a solution having a resin concentration of 20% by weight. The thus obtained solution was cast onto a smooth glass plate, dried at 20° C. for 8 hours, and subsequently peeled from the glass plate. The peeled coating film was further dried at 100° C. under reduced pressure for 8 hours to obtain a transparent resin substrate having a thickness of 0.100 mm, a length of 60 mm, and a width of 60 mm.

Figure 7:
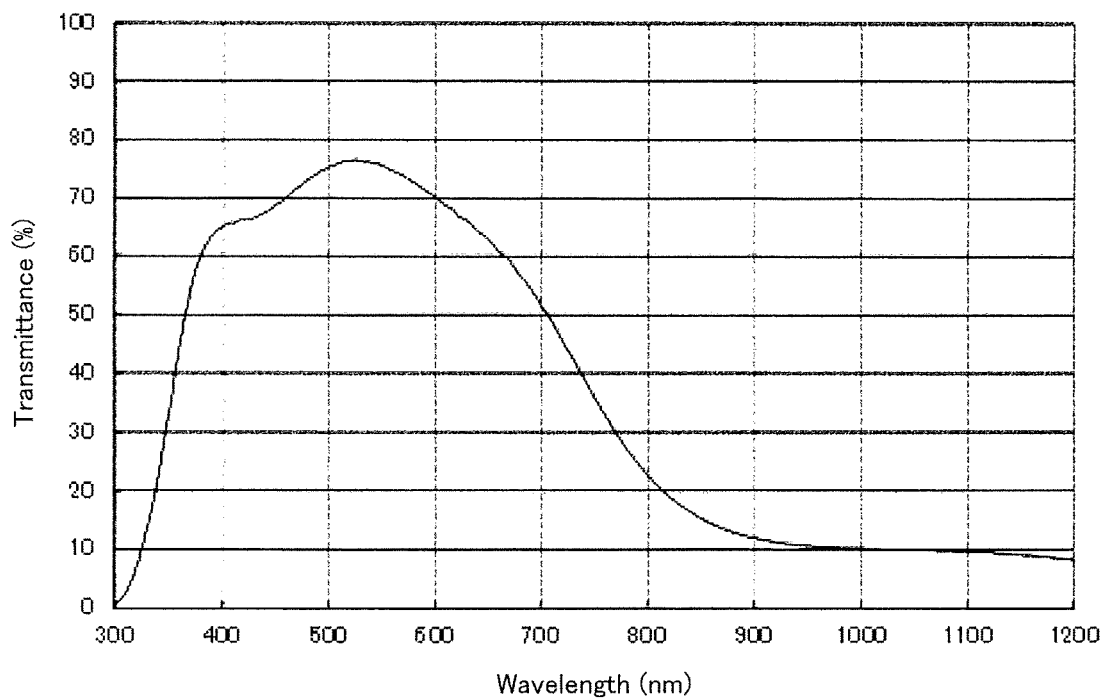
FIG. 7 is a graph showing the spectral transmittance of a base member including a resin layer containing near-infrared absorbing fine particles on both sides of a transparent resin substrate in Example 1.

Onto one side of the thus obtained transparent resin substrate, a near-infrared absorbing fine particle-containing resin composition (1) having the following composition was applied using a bar coater, and heated in an oven at 70° C. for 2 minutes to volatilize and remove a solvent. At this time, the conditions for the application using the bar coater were adjusted so as to achieve a thickness of 2 μm after the drying. Next, using a conveyor stepper, the resin composition (1) was subjected to exposure (exposure amount: 500 mJ/cm$^2$, 200 mW) to be cured, whereby a resin layer containing the near-infrared absorbing fine particles was formed on the transparent resin substrate. Likewise, a near-infrared absorbing fine particle-containing resin layer formed of the resin composition (1) was formed on the other side of the transparent resin substrate, and thus, a base member having the resin layer containing the near-infrared absorbing fine particles on both sides of the transparent resin substrate was obtained. The spectral transmittance of this base member was measured. FIG. 7 and Table 7 show the results.

Near-infrared absorbing fine particle-containing resin composition (1): 60 parts by weight of tricyclodecanedimethanol acrylate, 40 parts by weight of dipentaerythritol hexaacrylate, 5 parts by weight of 1-hydroxycyclohexylphenyl ketone, 117 parts by weight (approximately 33 parts by weight in terms of solids content) of a dispersion liquid of near-infrared absorbing fine particles (YMF-02A, manufactured by Sumitomo Metal Mining Co., Ltd., a commercial dispersion liquid of the second fine particles), methyl ethyl ketone (a solvent, total solids concentration (TSC): 30%)

Subsequently, a dielectric multilayer film (I) was formed on one side of the obtained base member, and furthermore, a dielectric multilayer film (II) was formed on the other side of the base member, whereby an optical filter having a thickness of approximately 0.109 mm was obtained.

Figure 8:
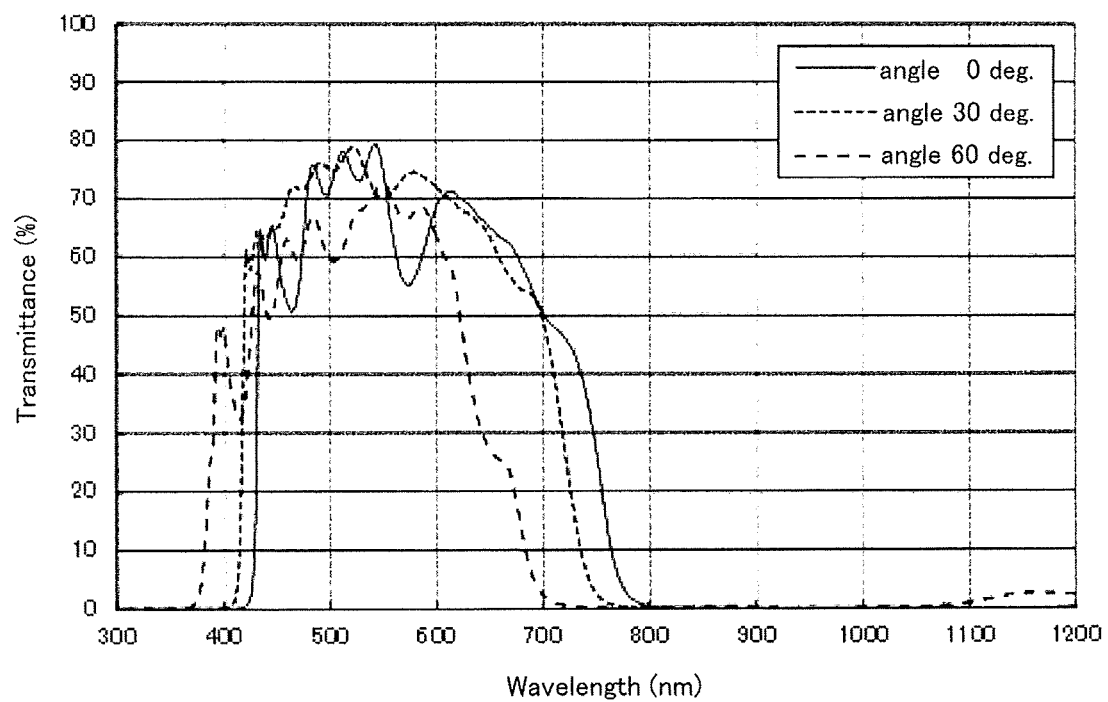
FIG. 8 is a graph showing spectral transmittances measured at an angle of 30 degrees with respect to a direction perpendicular to an optical filter of Example 1 and measured at an angle of 60 degrees with respect to the perpendicular direction, the optical filter including: a dielectric multilayer film (I) formed on one side of a base member; and a dielectric multilayer film (II) formed on the other side of the base member.

The dielectric multilayer film (I) was formed by alternately laminating silica (SiO$_2$) layers and titania (TiO$_2$) layers at a vapor deposition temperature of 100° C. (20 layers in total). The dielectric multilayer film (II) was formed by alternately laminating silica (SiO$_2$) layers and titania (TiO$_2$) layers at a vapor deposition temperature of 100° C. (18 layers in total). In any of the dielectric multilayer films (I) and (II), silica layers and titania layer were alternately laminated, from the base member side, in the order of a titania layer, a silica layer, a titania layer, . . . a silica layer, a titania layer, and a silica layer, and the outermost layer of the optical filter was a silica layer. Spectral transmittance in a direction perpendicular to the optical filter, spectral transmittance at an angle of 30 degrees with respect to the perpendicular direction, and spectral transmittance at an angle of 60 degrees with respect to the perpendicular direction were measured, and optical properties in various wavelength ranges were evaluated. FIG. 8 and Table 7 show the results.

The dielectric multilayer films (I) and (II) were designed as follows. Using optical thin film design software (Essential Macleod, manufactured by Thin Film Center Inc.), the thickness and the number of the layers were optimized in accordance with the wavelength dependence of the refractive index of the base member and the absorption properties of the applied near-infrared absorbing fine particles so as to achieve antireflection effects in the visible range and selective transmission/reflection performance in the near-infrared range. In the present example, software input parameters (Target values) in the optimization were those shown in the following Table 1.

TABLE 1

| Dielectric Multilayer Films | Wavelength (nm) | Incident Angle | Required Value | Target Tolerance | Type |
| --- | --- | --- | --- | --- | --- |
| (I) | 390~410 | 30 | 100 | 1 | Transmittance |
|  | 415~595 | 35 | 100 | 0.5 | Transmittance |
|  | 600~695 | 40 | 100 | 1 | Transmittance |
|  | 700~780 | 0 | 100 | 1 | Transmittance |
|  | 785~830 | 0 | 0 | 0.5 | Transmittance |
|  | 835~1100 | 0 | 0 | 1 | Transmittance |
| (II) | 395~450 | 30 | 100 | 1 | Transmittance |
|  | 455~500 | 60 | 100 | 0.7 | Transmittance |
|  | 505~570 | 40 | 100 | 1 | Transmittance |
|  | 575~800 | 0 | 100 | 1 | Transmittance |
|  | 1050~1150 | 0 | 0 | 0.5 | Transmittance |
|  | 1155~1250 | 0 | 0 | 0.3 | Transmittance |
|  | 1255~1300 | 0 | 0 | 0.5 | Transmittance |

As the result of the film configuration optimization, in Example 1, the dielectric multilayer film (I) was a vapor-deposited multilayer film having 20 laminated layers in which silica layers having a film thickness of 33 nm to 176 nm and titania layers having a film thickness of 10 nm to 99 nm were alternately laminated; and the dielectric multilayer film (II) was a vapor-deposited multilayer film having 18 laminated layers in which silica layers having a film thickness of 42 nm to 213 nm and titania layers having a film thickness of 13 nm to 122 nm were alternately laminated. Table 2 shows an example of the optimized film configuration.

TABLE 2

| Dielectric Multilayer Films | Layer | Material | Physical Film Thickness (nm) | Optocal Film Thickness (nd) |
| --- | --- | --- | --- | --- |
| (I) | 1 | SiO$_2$ | 89.3 | 0.235 λ |
|  | 2 | TiO$_2$ | 95.7 | 0.42 λ |
|  | 3 | SiO$_2$ | 175.9 | 0.463 λ |
|  | 4 | TiO$_2$ | 94.6 | 0.415 λ |
|  | 5 | SiO$_2$ | 172.1 | 0.453 λ |
|  | 6 | TiO$_2$ | 90.7 | 0.398 λ |
|  | 7 | SiO$_2$ | 167.0 | 0.439 λ |
|  | 8 | TiO$_2$ | 85.6 | 0.376 λ |
|  | 9 | SiO$_2$ | 162.7 | 0.428 λ |
|  | 10 | TiO$_2$ | 86.3 | 0.379 λ |
|  | 11 | SiO$_2$ | 163.3 | 0.43 λ |
|  | 12 | TiO$_2$ | 84.2 | 0.37 λ |
|  | 13 | SiO$_2$ | 163.1 | 0.429 λ |
|  | 14 | TiO$_2$ | 88.7 | 0.39 λ |
|  | 15 | SiO$_2$ | 170.1 | 0.447 λ |
|  | 16 | TiO$_2$ | 92.0 | 0.404 λ |
|  | 17 | SiO$_2$ | 175.1 | 0.461 λ |
|  | 18 | TiO$_2$ | 98.8 | 0.434 λ |
|  | 19 | SiO$_2$ | 33.2 | 0.087 λ |
|  | 20 | TiO$_2$ | 9.9 | 0.043 λ |
|  | Substrate |  |  |  |
| (II) | 21 | TiO$_2$ | 12.5 | 0.055 λ |
|  | 22 | SiO$_2$ | 41.9 | 0.11 λ |
|  | 23 | TiO$_2$ | 121.7 | 0.534 λ |
|  | 24 | SiO$_2$ | 208.1 | 0.547 λ |

TABLE 2-continued

| Dielectric Multilayer Films | Layer | Material | Physical Film Thickness (nm) | Optocal Film Thickness (nd) |
|---|---|---|---|---|
| | 25 | $TiO_2$ | 112.6 | 0.494 λ |
| | 26 | $SiO_2$ | 212.0 | 0.558 λ |
| | 27 | $TiO_2$ | 114.3 | 0.502 λ |
| | 28 | $SiO_2$ | 210.7 | 0.554 λ |
| | 29 | $TiO_2$ | 114.5 | 0.503 λ |
| | 30 | $SiO_2$ | 212.1 | 0.558 λ |
| | 31 | $TiO_2$ | 115.9 | 0.509 λ |
| | 32 | $SiO_2$ | 212.6 | 0.559 λ |
| | 33 | $TiO_2$ | 113.7 | 0.499 λ |
| | 34 | $SiO_2$ | 211.5 | 0.556 λ |
| | 35 | $TiO_2$ | 109.6 | 0.481 λ |
| | 36 | $SiO_2$ | 192.2 | 0.506 λ |
| | 37 | $TiO_2$ | 93.7 | 0.412 λ |
| | 38 | $SiO_2$ | 92.0 | 0.242 λ |

* λ = 550 nm

As shown in FIG. 8 and Table 7, it was confirmed that the optical filter obtained in Example 1 had good visible light transmittance and good near-infrared blocking properties even for obliquely incident light at an incident angle of 60 degrees.

Example 2 to 4

In Examples 2 to 4, a base member formed of a transparent resin substrate having, on both sides thereof, a resin layer containing near-infrared absorbing fine particles, and an optical filter were produced in the same manner as in Example 1, except that the resin, the solvent, the drying condition of the resin substrate, and the resin composition containing the near-infrared absorbing fine particles were changed as shown in Table 7. Table 7 shows the optical properties of the obtained base member and the obtained optical filter.

Near-infrared absorbing fine particle-containing resin composition (2): 60 parts by weight of tricyclodecanedimethanol acrylate, 40 parts by weight of dipentaerythritol hexaacrylate, 5 parts by weight of 1-hydroxycyclohexylphenyl ketone, 120 parts by weight (approximately 30 parts by weight in terms of solids content) of the dispersion liquid A of the near-infrared absorbing fine particles (P-1) obtained in Near-infrared Absorbing Fine Particle Production Example 1, methyl ethyl ketone (a solvent, total solids concentration (TSC): 30%)

Example 5

In Example 5, an optical filter having a base member formed of a transparent glass substrate having, on one side thereof, a resin layer containing near-infrared absorbing fine particles was produced using the following procedure and conditions.

Onto a transparent glass substrate "OA-10G (100 μm in thickness)", manufactured by Nippon Electric Glass Co., Ltd., which substrate was cut to a size of 60 mm in length and 60 mm in width (hereinafter, also referred to as "glass substrate (1)"), the above-described resin composition (1) was applied with a spin coater, and heated on a hot plate at 80° C. for 2 minutes to volatilize and remove a solvent. At this time, the conditions for the application using the spin coater were adjusted so as to achieve a thickness of 4 μm after the drying. Next, using a conveyor stepper, the resin composition (1) was subjected to exposure (exposure amount: 500 mJ/cm², 200 mW) to be cured, whereby a base member formed of a transparent glass substrate having a transparent resin layer containing the near-infrared absorbing fine particles was obtained. The spectral transmittance of this base member was measured, and optical properties thereof in various wavelength ranges were evaluated. Table 7 shows the results.

Subsequently, in the same manner as in Example 1, a dielectric multilayer film (III) having silica ($SiO_2$) layers and titania ($TiO_2$) layers alternately laminated therein (20 layers in total) was formed as a first optical layer on one side of the obtained base member; and furthermore, a dielectric multilayer film (IV) having silica ($SiO_2$) layers and titania ($TiO_2$) layers alternately laminated therein (18 layers in total) was formed as a second optical layer on the other side of the base member, whereby an optical filter having a thickness of approximately 0.109 mm was obtained. In the same manner as in Example 1, taking into consideration the properties of the near-infrared absorbing fine particles and the wavelength dependence of the refractive index of the base member, the dielectric multilayer films were designed using the same design parameters as those in Example 1. The spectral transmittance of the optical filter was measured, and optical properties thereof in various wavelength ranges were evaluated. Table 7 shows the results.

Example 6

In Example 6, an optical filter having a base member formed of a transparent resin substrate having, on one side thereof, a resin layer containing near-infrared absorbing fine particles was produced using the following procedure and conditions.

A transparent resin substrate was obtained as in the same manner as in Example 1, except that, unlike in Example 1, in the preparation of the resin solution, 0.02 part by weight of a near-infrared absorbing dye (X-1) represented by the following Formula (9) was added with respect to 100 parts of the resin A.

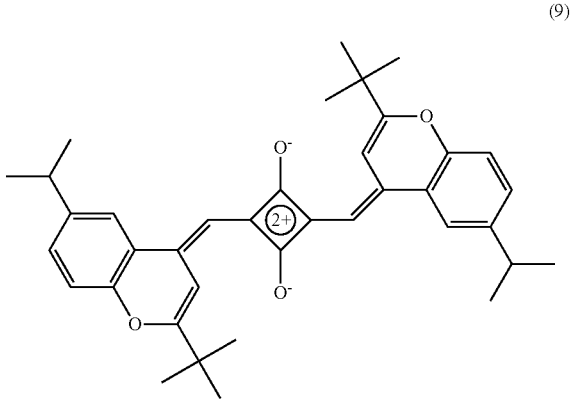

(9)

Onto one side of the thus obtained transparent resin substrate, a near-infrared absorbing fine particle-containing resin composition (3) having the following composition was applied using a bar coater, and heated in an oven at 70° C. for 2 minutes to volatilize and remove a solvent. At this time, the conditions for the application using the bar coater were adjusted so as to achieve a thickness of 2 μm after the drying. Next, using a conveyor stepper, the resin composition (3) was subjected to exposure (exposure amount: 500 mJ/cm², 200 mW) to be cured, whereby a resin layer containing the near-infrared absorbing fine particles was formed on the transparent resin substrate, whereby a base member having the resin layer containing the near-infrared absorbing fine particles on one side of the transparent resin substrate was obtained. The spectral transmittance of this base member was measured. FIG. 7 shows the results.

Near-infrared absorbing fine particle-containing resin composition (3): 80 parts by weight of tricyclodecanedimethanol acrylate, 20 parts by weight of dipentaerythritol hexaacrylate, 5 parts by weight of 1-hydroxycyclohexylphenyl ketone, 234 parts by weight (approximately 66 parts by weight in terms of solids content) of a dispersion liquid of the near-infrared absorbing fine particles (YMF-02A, manufactured by Sumitomo Metal Mining Co., Ltd., a commercial dispersion liquid of the second fine particles), methyl ethyl ketone (a solvent, total solids concentration (TSC): 30%)

Subsequently, in the same manner as in Example 1, a dielectric multilayer film (V) having silica ($SiO_2$) layers and titania ($TiO_2$) layers alternately laminated therein (20 layers in total) was formed as a first optical layer on one side of the obtained base member; and furthermore, a dielectric multilayer film (VI) having silica ($SiO_2$) layers and titania ($TiO_2$) layers alternately laminated therein (18 layers in total) was formed as a second optical layer on the other side of the base member, whereby an optical filter having a thickness of approximately 0.107 mm was obtained. In the same manner as in Example 1, taking into consideration the properties of the near-infrared absorbing fine particles and the wavelength dependence of the refractive index of the base member, the dielectric multilayer films were designed using the same design parameters as those in Example 1. The spectral transmittance of the optical filter was measured, and optical properties thereof in various wavelength ranges were evaluated. Table 7 shows the results.

Example 7

In Example 7, an optical filter having a base member formed of a resin substrate containing near-infrared absorbing fine particles was produced using the following procedure and conditions.

100 parts by weight of a methacrylic resin HV153, manufactured by ADELL Co., Ltd. (hereinafter, also referred to as "resin D") and 59 parts by weight of the near-infrared absorbing particles (P-2) obtained in Near-infrared Absorbing Fine Particle Production Example 2 were mixed. To the resulting mixed solution, zirconia beads having a diameter of 0.5 mm were added, and ground using a ball mill to obtain a dispersion liquid of the near-infrared absorbing particles (P-2). The obtained dispersion liquid was applied onto a 0.7-mm-thick soda-lime glass substrate using a spin coater, and heated at 120° C. for 2 minutes to form a resin layer containing the near-infrared absorbing fine particles on the glass substrate. At this time, the conditions for the application using the spin coater were adjusted so as to achieve a thickness of 100 μm after the drying. Subsequently, the resin layer containing the near-infrared absorbing fine particles was peeled from the glass plate to obtain a base member formed of a resin substrate containing the near-infrared absorbing fine particles. The spectral transmittance of this base member was measured. FIG. 7 shows the results.

Subsequently, in the same manner as in Example 1, a dielectric multilayer film (VII) having silica ($SiO_2$) layers and titania ($TiO_2$) layers alternately laminated therein (20 layers in total) was formed as a first optical layer on one side of the obtained base member; and furthermore, a dielectric multilayer film (VIII) having silica ($SiO_2$) layers and titania ($TiO_2$) layers alternately laminated therein (18 layers in total) was formed as a second optical layer on the other side of the base member, whereby an optical filter having a thickness of approximately 0.105 mm was obtained. In the same manner as in Example 1, taking into consideration the properties of the near-infrared absorbing fine particles and the wavelength dependence of the refractive index of the base member, the dielectric multilayer films were designed using the same design parameters as those in Example 1. The spectral transmittance of the optical filter was measured, and optical properties thereof in various wavelength ranges were evaluated. Table 7 shows the results.

Example 8

In Example 8, an optical filter having a base member formed of a near-infrared absorbing glass substrate having, on one side thereof, a resin layer containing near-infrared absorbing fine particles was produced using the following procedure and conditions.

A base member formed of a near-infrared absorbing glass substrate having, on one side thereof, a resin layer containing the near-infrared absorbing fine particles, and an optical filter were produced as in the same manner as in Example 5, except that, in place of the glass substrate (1) in Example 5, use was made of a near-infrared absorbing glass substrate BS-6 (210 μm in thickness), manufactured by Matsunami Glass Ind., Ltd., which substrate was cut to a size of 60 mm in length and 60 mm in width (hereinafter, also referred to as "glass substrate (2)"). Table 7 shows the optical properties of the obtained base member and the obtained optical filter.

Comparative Example 1

Figure 9:
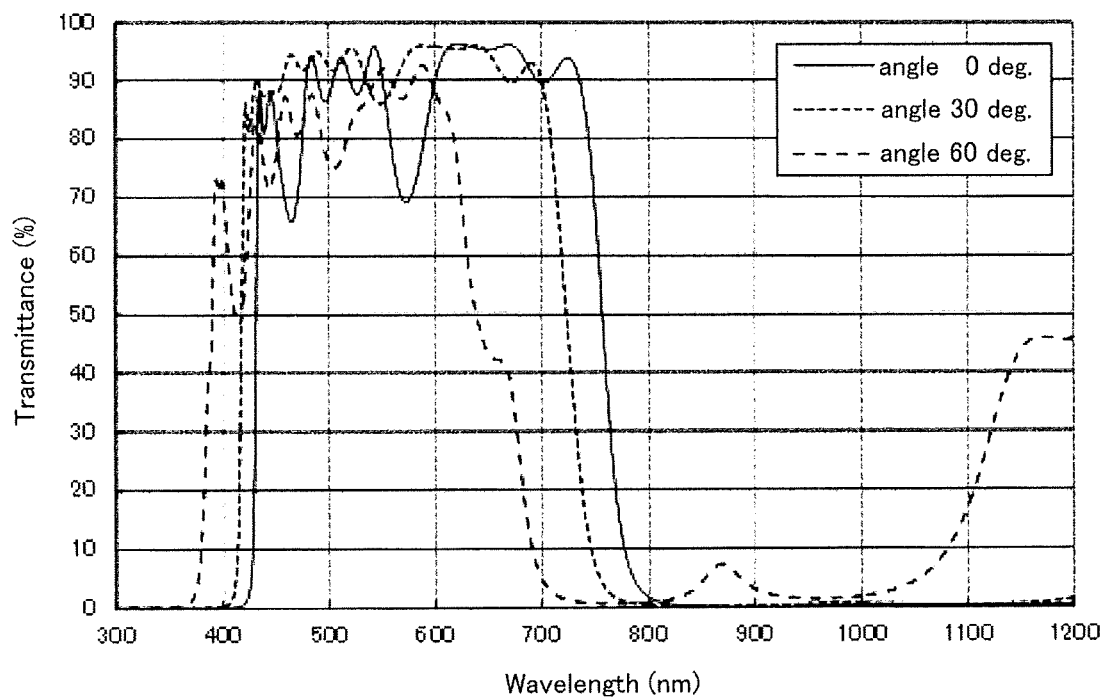
FIG. 9 is a graph showing the spectral transmittance of an optical filter of Comparative Example 1.

A base member and an optical filter were produced in the same manner as in Example 1, except that, unlike in Example 1, the resin layer containing the near-infrared absorbing fine particles was not formed on the transparent resin substrate. FIG. 9 and Table 7 show the optical properties of the obtained optical filter. It was confirmed that the optical filter obtained in Comparative Example 1 exhibited relatively good visible light transmittance, but, had poor near-infrared blocking properties under the condition of an incident angle of 60 degrees.

Comparative Example 2

A base member formed of a transparent resin substrate having, on both sides thereof, a resin layer containing the near-infrared absorbing fine particles was produced in the same procedure as in Example 1, and, using the base member as it is as an optical filter, the spectral properties thereof were evaluated. Table 7 shows the results. It was confirmed that the optical filter obtained in Comparative Example 2 had poor near-infrared blocking properties.

Comparative Example 3

An optical filter was produced in the same manner as in Example 1, except that the glass substrate (1) was used as a base member. Table 7 shows the optical properties of the base member and the obtained optical filter. It was confirmed that the optical filter obtained in Comparative Example 3 exhibited relatively good visible light transmittance, but, had poor near-infrared blocking properties under the condition of an incident angle of 60 degrees.

Comparative Example 4

A base member and an optical filter were produced in the same manner as in Example 6, except that, unlike in Example 6, the resin layer containing the near-infrared absorbing fine particles was not formed on the transparent resin substrate. Table 7 shows the optical properties of the obtained optical filter. It was confirmed that the optical filter obtained in Comparative Example 4 exhibited relatively good visible light transmittance, but, had poor near-infrared blocking properties under the condition of an incident angle of 60 degrees.

Comparative Example 5

A base member formed of a transparent resin substrate having, on both sides thereof, a resin layer containing the near-infrared absorbing fine particles was produced in the same procedure as in Example 1. Subsequently, a dielectric multilayer film (III) was formed on one side of the obtained base member, and furthermore, a dielectric multilayer film (IV) was formed on the other side of the base member, whereby an optical filter having a thickness of approximately 0.108 mm was obtained.

The dielectric multilayer film (III) and the dielectric multilayer film (IV) were formed on the base member in the same procedure as in Example 1, except that input parameters (Target values) into the optical thin film design software (Essential Macleod, manufactured by Thin Film Center Inc.) were those in the following Table 3.

TABLE 3

| Dielectric Multilayer Films | Software Input Parameters | | | | |
| --- | --- | --- | --- | --- | --- |
|  | Wavelength (nm) | Incident Angle | Required Value | Target Tolerance | Type |
| (III), (IV) | 380~450 | 0 | 100 | 1 | Transmittance |
|  | 455~595 | 30 | 100 | 0.5 | Transmittance |
|  | 600~680 | 0 | 100 | 0.7 | Transmittance |
|  | 710~970 | 0 | 0 | 0.5 | Transmittance |

As the result of the film configuration optimization, in Comparative Example 5, the dielectric multilayer film (III) and the dielectric multilayer film (IV) were each a vapor-deposited multilayer film having 20 laminated layers in which silica layers having a film thickness of 32 nm to 157 nm and titania layers having a film thickness of 10 nm to 95 nm were alternately laminated. Table 4 shows an example of the optimized film configuration.

TABLE 4

| Dielectric Multilayer Films | Layer | Material | Physical Film Thickness (nm) | Optocal Film Thickness (nd) |
| --- | --- | --- | --- | --- |
| (III) | 1 | SiO$_2$ | 76.0 | 0.200 λ |
|  | 2 | TiO$_2$ | 86.7 | 0.381 λ |
|  | 3 | SiO$_2$ | 152.5 | 0.401 λ |
|  | 4 | TiO$_2$ | 84.3 | 0.370 λ |
|  | 5 | SiO$_2$ | 146.9 | 0.386 λ |
|  | 6 | TiO$_2$ | 82.3 | 0.361 λ |
|  | 7 | SiO$_2$ | 145.7 | 0.383 λ |
|  | 8 | TiO$_2$ | 81.2 | 0.357 λ |
|  | 9 | SiO$_2$ | 145.1 | 0.382 λ |

TABLE 4-continued

| Dielectric Multilayer Films | Layer | Material | Physical Film Thickness (nm) | Optocal Film Thickness (nd) |
| --- | --- | --- | --- | --- |
|  | 10 | TiO$_2$ | 81.6 | 0.358 λ |
|  | 11 | SiO$_2$ | 144.4 | 0.380 λ |
|  | 12 | TiO$_2$ | 81.6 | 0.359 λ |
|  | 13 | SiO$_2$ | 146.3 | 0.385 λ |
|  | 14 | TiO$_2$ | 81.8 | 0.359 λ |
|  | 15 | SiO$_2$ | 147.5 | 0.388 λ |
|  | 16 | TiO$_2$ | 86.1 | 0.378 λ |
|  | 17 | SiO$_2$ | 156.6 | 0.412 λ |
|  | 18 | TiO$_2$ | 94.7 | 0.416 λ |
|  | 19 | SiO$_2$ | 31.9 | 0.084 λ |
|  | 20 | TiO$_2$ | 9.5 | 0.042 λ |
|  | Substrate | | | |
| (IV) | 21 | TiO$_2$ | 9.5 | 0.042 λ |
|  | 22 | SiO$_2$ | 31.9 | 0.084 λ |
|  | 23 | TiO$_2$ | 94.7 | 0.416 λ |
|  | 24 | SiO$_2$ | 156.6 | 0.412 λ |
|  | 25 | TiO$_2$ | 86.1 | 0.378 λ |
|  | 26 | SiO$_2$ | 147.5 | 0.388 λ |
|  | 27 | TiO$_2$ | 81.8 | 0.359 λ |
|  | 28 | SiO$_2$ | 146.3 | 0.385 λ |
|  | 29 | TiO$_2$ | 81.6 | 0.359 λ |
|  | 30 | SiO$_2$ | 144.4 | 0.380 λ |
|  | 31 | TiO$_2$ | 81.6 | 0.358 λ |
|  | 32 | SiO$_2$ | 145.1 | 0.382 λ |
|  | 33 | TiO$_2$ | 81.2 | 0.357 λ |
|  | 34 | SiO$_2$ | 145.7 | 0.383 λ |
|  | 35 | TiO$_2$ | 82.3 | 0.361 λ |
|  | 36 | SiO$_2$ | 146.9 | 0.386 λ |
|  | 37 | TiO$_2$ | 84.3 | 0.370 λ |
|  | 38 | SiO$_2$ | 152.5 | 0.401 λ |
|  | 39 | TiO$_2$ | 86.7 | 0.381 λ |
|  | 40 | SiO$_2$ | 76.0 | 0.200 λ |

* λ = 550 nm

Figure 10:
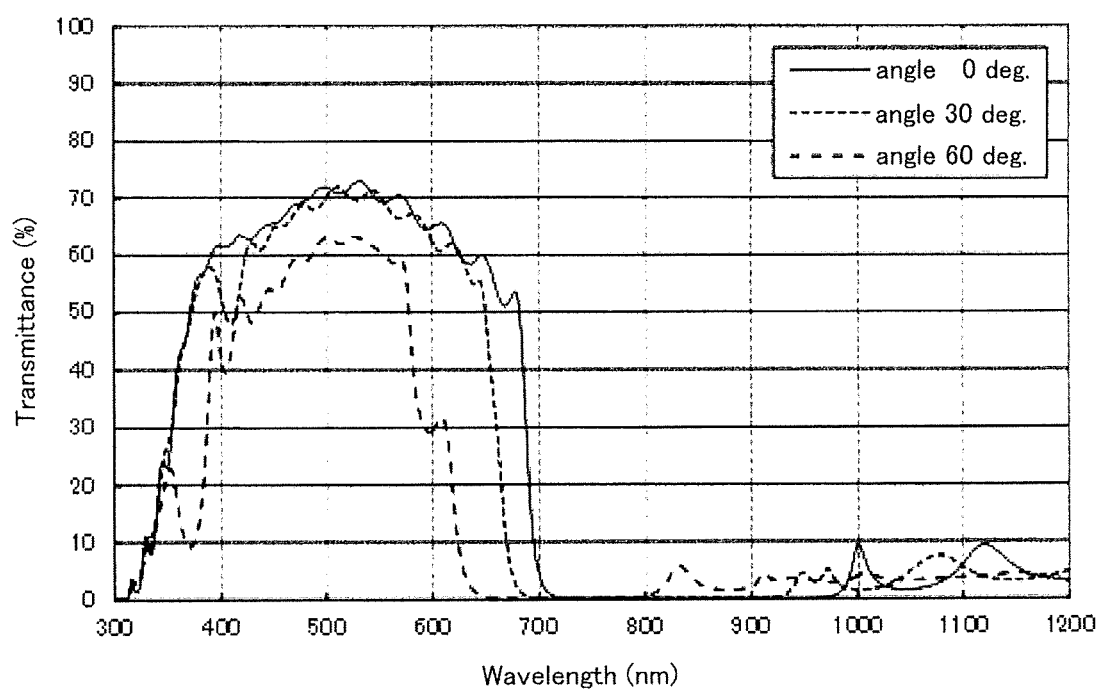
FIG. 10 is a graph showing the spectral transmittance of an optical filter of Comparative Example 5.

FIG. 10 and Table 7 show the optical properties of the obtained optical filter. It was confirmed that the optical filter obtained in Comparative Example 5 had poor near-infrared blocking properties under the condition of an incident angle of 60 degrees, and besides, transmittance in a wavelength range corresponding to red at a wavelength of 580 nm to 620 nm was considerably lower.

Comparative Example 6

A base member formed of a transparent resin substrate having, on both sides thereof, a resin layer containing the near-infrared absorbing fine particles was produced in the same procedure as in Example 1. Subsequently, a dielectric multilayer film (V) was formed on one side of the obtained base member, and furthermore, a dielectric multilayer film (VI) was formed on the other side of the base member, whereby an optical filter having a thickness of approximately 0.110 mm was obtained.

The dielectric multilayer film (V) and the dielectric multilayer film (VI) were formed on the base member in the same procedure as in Example 1, except that input parameters (Target values) into the optical thin film design software (Essential Macleod, manufactured by Thin Film Center Inc.) were those in the following Table 5.

TABLE 5

| Dielectric Multilayer Films | Software Input Parameters | | | | |
|---|---|---|---|---|---|
| | Wavelength (nm) | Incident Angle | Required Value | Target Tolerance | Type |
| (V) | 710~790 | 30 | 100 | 0.8 | Transmittance |
| | 800~1000 | 0 | 0 | 0.8 | Transmittance |
| | 1005~1100 | 0 | 0 | 0.3 | Transmittance |
| (VI) | 400~650 | 0 | 0 | 1 | Transmittance |
| | 750~800 | 30 | 100 | 1 | Transmittance |
| | 1050~1250 | 0 | 0 | 0.5 | Transmittance |

As the result of the film configuration optimization, in Comparative Example 6, the dielectric multilayer film (V) was a vapor-deposited multilayer film having 21 laminated layers in which silica layers having a film thickness of 149 nm to 194 nm and titania layers having a film thickness of 97 nm to 439 nm were alternately laminated; and the dielectric multilayer film (VI) was a vapor-deposited multilayer film having 19 laminated layers in which silica layers having a film thickness of 41 nm to 596 nm and titania layers having a film thickness of 22 nm to 137 nm were alternately laminated. Table 6 shows an example of the optimized film configuration.

TABLE 6

| Dielectric Multilayer Films | Layer | Material | Physical Film Thickness (nm) | Optocal Film Thickness (nd) |
|---|---|---|---|---|
| (V) | 1 | $TiO_2$ | 112.3 | 0.493 λ |
| | 2 | $SiO_2$ | 183.9 | 0.484 λ |
| | 3 | $TiO_2$ | 106.6 | 0.468 λ |
| | 4 | $SiO_2$ | 162.1 | 0.426 λ |
| | 5 | $TiO_2$ | 102.3 | 0.449 λ |
| | 6 | $SiO_2$ | 194.4 | 0.511 λ |
| | 7 | $TiO_2$ | 143.5 | 0.630 λ |
| | 8 | $SiO_2$ | 159.4 | 0.419 λ |
| | 9 | $TiO_2$ | 293.4 | 1.289 λ |
| | 10 | $SiO_2$ | 161.8 | 0.426 λ |
| | 11 | $TiO_2$ | 103.1 | 0.453 λ |
| | 12 | $SiO_2$ | 165.8 | 0.436 λ |
| | 13 | $TiO_2$ | 96.5 | 0.424 λ |
| | 14 | $SiO_2$ | 163.4 | 0.430 λ |
| | 15 | $TiO_2$ | 439.4 | 1.930 λ |
| | 16 | $SiO_2$ | 149.3 | 0.393 λ |
| | 17 | $TiO_2$ | 96.7 | 0.425 λ |
| | 18 | $SiO_2$ | 158.6 | 0.417 λ |
| | 19 | $TiO_2$ | 102.7 | 0.451 λ |
| | 18 | $SiO_2$ | 168.4 | 0.443 λ |
| | 19 | $TiO_2$ | 106.3 | 0.467 λ |
| | 20 | $SiO_2$ | 164.5 | 0.433 λ |
| | 21 | $TiO_2$ | 99.5 | 0.437 λ |
| | Substrate | | | |
| (VI) | 22 | $TiO_2$ | 137.3 | 0.603 λ |
| | 23 | $SiO_2$ | 110.3 | 0.290 λ |
| | 24 | $TiO_2$ | 37.9 | 0.167 λ |
| | 25 | $SiO_2$ | 57.4 | 0.151 λ |
| | 26 | $TiO_2$ | 74.0 | 0.325 λ |
| | 27 | $SiO_2$ | 595.6 | 1.567 λ |
| | 28 | $TiO_2$ | 79.7 | 0.350 λ |
| | 29 | $SiO_2$ | 255.1 | 0.671 λ |
| | 30 | $TiO_2$ | 93.6 | 0.411 λ |
| | 31 | $SiO_2$ | 255.5 | 0.672 λ |
| | 32 | $TiO_2$ | 85.6 | 0.376 λ |
| | 33 | $SiO_2$ | 134.1 | 0.353 λ |
| | 34 | $TiO_2$ | 21.6 | 0.095 λ |
| | 35 | $SiO_2$ | 84.2 | 0.221 λ |
| | 36 | $TiO_2$ | 71.4 | 0.313 λ |

TABLE 6-continued

| Dielectric Multilayer Films | Layer | Material | Physical Film Thickness (nm) | Optocal Film Thickness (nd) |
|---|---|---|---|---|
| | 37 | $SiO_2$ | 187.0 | 0.492 λ |
| | 38 | $TiO_2$ | 57.8 | 0.254 λ |
| | 39 | $SiO_2$ | 41.0 | 0.108 λ |
| | 40 | $TiO_2$ | 57.5 | 0.253 λ |

* λ = 550 nm

Figure 11:
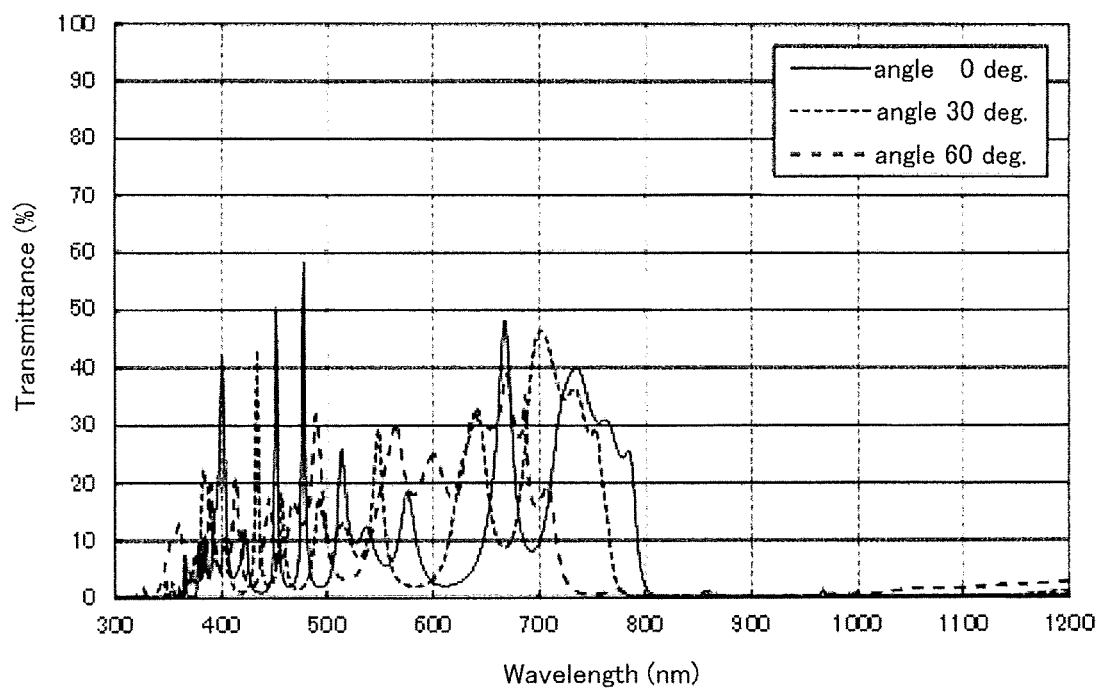
FIG. 11 is a graph showing the spectral transmittance of an optical filter of Comparative Example 6.

FIG. 11 and Table 7 show the optical properties of the obtained optical filter. It was confirmed that the optical filter obtained in Comparative Example 6 had good near-infrared blocking properties, but exhibited poor visible light transmittance.

The configurations of the base members, the compounds, and others applied in Examples and Comparative Examples are as follows.

Configuration of Base Member:

Configuration (1): formed of a transparent resin substrate having, on both sides thereof, a resin layer containing near-infrared absorbing fine particles Configuration (2): formed of a transparent glass substrate having, on one side thereof, a resin layer containing near-infrared absorbing fine particles Configuration (3): formed of a transparent resin substrate having, on one side thereof, a resin layer containing near-infrared absorbing fine particles Configuration (4): a base member formed of a resin substrate containing near-infrared absorbing fine particles Configuration (5): formed of a near-infrared absorbing glass substrate having, on one side thereof, a resin layer containing near-infrared absorbing fine particles Configuration (6): a transparent resin substrate (Comparative Example) Configuration (7): a transparent glass substrate (Comparative Example)

Transparent Resin:

Resin A: a cyclic olefin-based resin (Resin Synthesis Example 1)

Resin B: an aromatic polyether-based resin (Resin Synthesis Example 2)

Resin C: a polyimide-based resin (Resin Synthesis Example 3)

Resin D: a methacrylic resin, HV153, manufactured by ADELL Co., Ltd.

Glass Substrate:

Glass substrate (1): a transparent glass substrate cut to a size of 60 mm in length and 60 mm in width, "OA-10G (100 μm in thickness)" (manufactured by Nippon Electric Glass Co., Ltd.)

Glass substrate (2): a near-infrared absorbing glass substrate cut to a size of 60 mm in length and 60 mm in width, "BS-6 (210 μm in thickness)" (manufactured by Matsunami Glass Ind., Ltd.)

Near-Infrared Absorbing Dye:

Compound (X-1): the above-mentioned compound (X-1) (having an absorption maximum wavelength in dichloromethane of 776 nm)

Solvent:

Solvent (1): methylene chloride

Solvent (2): N, N-dimethylacetamide

The conditions for the drying of the (transparent) resin substrates in Examples and Comparative Examples in Table 7 are as follows. It should be noted that a coating film was peeled from a glass plate before the drying under reduced pressure.

Drying Conditions for Resin Substrate:

Condition (1): drying under the condition of 20 C°/8 hr, followed by drying under reduced pressure under the condition of 100 C°/8 hr.

Condition (2): drying under the condition of 60 C°/8 hr, followed by drying under the condition of 80 C°/8 hr, further followed by drying under reduced pressure under the condition of 140 C°/8 hr.

Condition (3): drying under the condition of 120 C°/2 min

TABLE 7

| | | | | Ex. 1 | Ex. 2 | Ex. 3 | Ex. 4 | Ex. 5 | Ex. 6 | Ex. 7 |
|---|---|---|---|---|---|---|---|---|---|---|
| Constitution of Base Member | Configuration of Base Member | | | (1) | (1) | (1) | (1) | (2) | (3) | (4) |
| | Composition of Transparent Resin Substrate or Resin Support | Transparent Resin (parts by weight) | Resin A | 100 | | | 100 | 100 | 100 | |
| | | | Resin B | | 100 | | | | | |
| | | | Resin C | | | 100 | | | | |
| | | | Resin D | | | | | | | 100 |
| | | near-IR Absorbing Fine Particles (parts by weight) | P-2 | | | | | | | 59 |
| | | near-IR Absorbing Dye (parts by weight) | X-1 | | | | | | 0.02 | |
| | | Solvent | | (1) | (2) | (2) | (1) | — | (1) | — |
| | Resin Substrate (Support) Drying Conditions | | | (1) | (2) | (2) | (1) | — | (1) | (3) |
| | Glass Substrate | | | — | — | — | — | (1) | — | — |
| | Resin Composition Containing near-IR Absorbing Fine Particles | | | (1) | (1) | (1) | (2) | (1) | (3) | — |
| Optical Property of Base Member | Average Transmittance in a Wavelength Range of 400 nm to 650 nm (%) | | | 71 | 69 | 70 | 72 | 71 | 70 | 76 |
| | Average Optical Density in a Wavelength Range of 800 nm to 1200 nm (%) | | | 12 | 11 | 11 | 14 | 13 | 12 | 5 |
| Dielectric Multilayer Film (Both Side) | | Number of One Side layers | | 20 | 20 | 20 | 20 | 20 | 20 | 20 |
| | | Number of One Side layers | | 18 | 18 | 18 | 18 | 18 | 18 | 18 |
| Optical Property of Optical Filters | Average Transmittance in a Wavelength Range of 400 nm to 650 nm (%) | incident angle of 0 degrees | | 59 | 56 | 57 | 61 | 59 | 58 | 64 |
| | | incident angle of 30 degrees | | 66 | 62 | 62 | 66 | 67 | 65 | 71 |
| | | incident angle of 60 degrees | | 58 | 53 | 54 | 59 | 58 | 57 | 64 |
| | Average Transmittance in a Wavelength Range of 430 nm to 470 nm (%) | incident angle of 0 degrees | | 56 | 52 | 53 | 55 | 57 | 55 | 62 |
| | | incident angle of 30 degrees | | 67 | 63 | 64 | 67 | 67 | 67 | 71 |
| | | incident angle of 60 degrees | | 57 | 54 | 54 | 57 | 57 | 56 | 62 |
| | Average Transmittance in a Wavelength Range of 520 nm to 560 nm (%) | incident angle of 0 degrees | | 74 | 70 | 71 | 75 | 74 | 74 | 78 |
| | | incident angle of 30 degrees | | 73 | 70 | 71 | 73 | 74 | 74 | 77 |
| | | incident angle of 60 degrees | | 70 | 67 | 68 | 70 | 69 | 70 | 74 |
| | Average Transmittance in a Wavelength Range of 580 nm to 620 nm (%) | incident angle of 0 degrees | | 66 | 63 | 64 | 66 | 67 | 63 | 67 |
| | | incident angle of 30 degrees | | 72 | 68 | 68 | 73 | 73 | 69 | 72 |
| | | incident angle of 60 degrees | | 63 | 59 | 60 | 63 | 63 | 60 | 63 |
| | Average Optical Density in a Wavelength Range of 800 nm to 1200 nm (%) | incident angle of 0 degrees | | 3.8 | 3.8 | 3.8 | 3.9 | 3.7 | 3.8 | 4.1 |
| | | incident angle of 30 degrees | | 3.7 | 3.3 | 3.8 | 3.8 | 3.6 | 3.7 | 4.0 |
| | | incident angle of 60 degrees | | 2.5 | 2.6 | 2.7 | 2.8 | 2.5 | 2.5 | 3.0 |

| | | | | Ex. 8 | Compara Ex. 1 | Compara Ex. 2 | Compara Ex. 3 | Compara Ex. 4 | Compara Ex. 5 | Compara Ex. 6 |
|---|---|---|---|---|---|---|---|---|---|---|
| Constitution of Base Member | Configuration of Base Member | | | (5) | (6) | (1) | (7) | (6) | (1) | (1) |
| | Composition of Transparent Resin Substrate or Resin Support | Transparent Resin (parts by weight) | Resin A | | 100 | 100 | | 100 | 100 | 100 |
| | | | Resin B | | | | | | | |
| | | | Resin C | | | | | | | |
| | | | Resin D | | | | | | | |
| | | near-IR Absorbing Fine Particles (parts by weight) | P-2 | | | | | | | |
| | | near-IR Absorbing Dye (parts by weight) | X-1 | | | | | | 0.02 | |
| | | Solvent | | — | (1) | (1) | — | (1) | (1) | (1) |

TABLE 7-continued

| | | | | | | | | |
|---|---|---|---|---|---|---|---|---|
| | Resin Substrate (Support) Drying Conditions | | — | (1) | (1) | — | (1) | (1) | (1) |
| | Glass Substrate | | (2) | — | — | (1) | — | — | — |
| | Resin Composition Containing near-IR Absorbing Fine Particles | | (2) | — | (1) | — | — | (1) | (1) |
| Optical Property of Base Member | Average Transmittance in a Wavelength Range of 400 nm to 650 nm (%) | | 62 | 91 | 71 | 91 | 88 | 71 | 71 |
| | Average Optical Density in a Wavelength Range of 800 nm to 1200 nm (%) | | 3 | 91 | 12 | 91 | 89 | 12 | 12 |
| Dielectric Multilayer Film (Both Side) | | Number of One Side layers | 20 | 20 | — | 20 | 20 | 20 | 21 |
| | | Number of One Side layers | 18 | 18 | — | 18 | 18 | 20 | 19 |
| Optical Property of Optical Filters | Average Transmittance in a Wavelength Range of 400 nm to 650 nm (%) | incident angle of 0 degrees | 50 | 75 | 71 | 74 | 72 | 67 | 8 |
| | | incident angle of 30 degrees | 56 | 86 | 70 | 86 | 84 | 64 | 10 |
| | | incident angle of 60 degrees | 48 | 78 | 61 | 77 | 76 | 46 | 15 |
| | Average Transmittance in a Wavelength Range of 430 nm to 470 nm (%) | incident angle of 0 degrees | 50 | 74 | 69 | 75 | 71 | 66 | 6 |
| | | incident angle of 30 degrees | 61 | 90 | 68 | 90 | 87 | 64 | 9 |
| | | incident angle of 60 degrees | 51 | 80 | 59 | 81 | 77 | 54 | 10 |
| | Average Transmittance in a Wavelength Range of 520 nm to 560 nm (%) | incident angle of 0 degrees | 68 | 90 | 76 | 90 | 88 | 71 | 9 |
| | | incident angle of 30 degrees | 69 | 90 | 75 | 90 | 88 | 70 | 13 |
| | | incident angle of 60 degrees | 65 | 88 | 67 | 87 | 86 | 62 | 12 |
| | Average Transmittance in a Wavelength Range of 580 nm to 620 nm (%) | incident angle of 0 degrees | 53 | 87 | 70 | 88 | 84 | 65 | 5 |
| | | incident angle of 30 degrees | 60 | 96 | 69 | 95 | 92 | 64 | 5 |
| | | incident angle of 60 degrees | 51 | 88 | 60 | 88 | 85 | 31 | 21 |
| | Average Optical Density in a Wavelength Range of 800 nm to 1200 nm (%) | incident angle of 0 degrees | 4.4 | 2.6 | 1.1 | 2.5 | 2.7 | 2.7 | 3.4 |
| | | incident angle of 30 degrees | 4.2 | 2.5 | 1.1 | 2.5 | 2.5 | 2.3 | 3.2 |
| | | incident angle of 60 degrees | 3.3 | 1.3 | 1.2 | 1.2 | 1.3 | 1.5 | 2.3 |

The invention claimed is:

1. An optical filter, comprising:
an antireflection film having an antireflection property in a visible region; and
a base member over and in contact with the antireflection film, the base member consisting of a transparent resin substrate and a resin layer on and in contact with the transparent resin substrate,
wherein near-infrared absorbing fine particles having absorption in a wavelength of 800 nm to 1,200 nm are included in the transparent resin substrate and the resin layer.

2. The optical filter according to claim 1, wherein the near-infrared absorbing fine particles have an average particle diameter of 1 nm to 200 nm.

3. The optical filter according to claim 1, further comprising a dielectric multilayer having a property of reflecting infrared rays on and in contact with the base member.

4. The optical filter according to claim 1, wherein the transparent resin substrate comprises a transparent resin, and
wherein the transparent resin is at least one resin selected from the group consisting of a cyclic polyolefin-based resin, an aromatic polyether-based resin, a polyimide-based resin, a fluorene polycarbonate-based resin, a fluorene polyester-based resin, a polycarbonate-based resin, a polyamide-based resin, a polyarylate-based resin, a polysulfone-based resin, a polyether sulfone-based resin, a polyparaphenylene-based resin, a polyamide-imide-based resin, a polyethylene naphthalate-based resin, a fluorinated aromatic polymer-based resin, an acrylic resin, a modified acrylic resin, an epoxy-based resin, a curable allyl ester-based resin, an ultraviolet-curable silsesquioxane-based resin, an ultraviolet-curable acrylic resin, and an ultraviolet-curable vinyl-based resin.

5. The optical filter according to claim 1, wherein the resin layer comprises a transparent resin, and
wherein the transparent resin is at least one resin selected from the group consisting of a cyclic polyolefin-based resin, an aromatic polyether-based resin, a polyimide-based resin, a fluorene polycarbonate-based resin, a fluorene polyester-based resin, a polycarbonate-based resin, a polyamide-based resin, a polyarylate-based resin, a polysulfone-based resin, a polyether sulfone-based resin, a polyparaphenylene-based resin, a polyamide-imide-based resin, a polyethylene naphthalate-based resin, a fluorinated aromatic polymer-based resin, an acrylic resin, a modified acrylic resin, an epoxy based resin, a curable allyl ester-based resin, an ultraviolet-curable silsesquioxane-based resin, an ultraviolet-curable acrylic resin, and an ultraviolet-curable vinyl-based resin.

6. The optical filter according to claim 1, wherein the near-infrared absorbing fine particles are a metal oxide represented by a general formula $M_xW_yO_z$,
wherein
M is one or a plurality of elements selected from H, alkali metals, alkaline earth metals, rare earth elements, Mg, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, F, P, S, Se, Br, Te, Ti, Nb, Mo, Ta, Re, Be, Hf, Os, Bi, and I;

W is tungsten;

O is oxygen;

$0.001 \leq x/y \leq 1$; and $2.2 \leq z/y \leq 3.0$.

7. The optical filter according to claim 1, wherein the optical filter satisfies requirements (a) and (b) below:
 (a) in a wavelength range of 400 nm to 650 nm, an average of transmittance of any of light incident from a perpendicular direction to the optical filter, light obliquely incident at an angle of 30 degrees with respect to the perpendicular direction, and light obliquely incident at an angle of 60 degrees with respect to the perpendicular direction is 45% or higher and lower than 85%; and
 (b) in a wavelength range of 800 nm to 1,200 nm, an average of optical density (OD value) of any of light incident from the perpendicular direction to the optical filter, light obliquely incident at an angle of 30 degrees with respect to the perpendicular direction, and light obliquely incident at an angle of 60 degrees with respect to the perpendicular direction is 1.7 or higher.

8. An ambient light sensor, comprising:
 a photoelectric conversion element; and
 an optical filter on a light-receiving surface side of the photoelectric conversion element,
 wherein the optical filter comprises:
  an antireflection film having an antireflection property in a visible region; and
  a base member consisting of a transparent resin substrate and a resin layer on and in contact with the transparent resin substrate,
 wherein near-infrared absorbing fine particles having absorption in a wavelength of 800 nm to 1,200 nm are included in the transparent resin substrate and the resin layer.

9. The optical filter according to claim 8, wherein the near-infrared absorbing fine particles have an average particle diameter of 1 nm to 200 nm.

10. The optical filter according to claim 8, further comprising a first dielectric multilayer film having a property of reflecting infrared rays on and in contact with the base member.

11. The optical filter according to claim 8, wherein the transparent resin substrate comprises a transparent resin, and
 wherein the transparent resin is at least one resin selected from the group consisting of a cyclic polyolefin-based resin, an aromatic polyether-based resin, a polyimide-based resin, a fluorene polycarbonate-based resin, a fluorene polyester-based resin, a polycarbonate-based resin, a polyamide-based resin, a polyarylate-based resin, a polysulfone-based resin, a polyether sulfone-based resin, a polyparaphenylene-based resin, a polyamide-imide-based resin, a polyethylene naphthalate-based resin, a fluorinated aromatic polymer-based resin, an acrylic resin, a modified acrylic resin, an epoxy based resin, a curable allyl ester-based resin, an ultraviolet-curable silsesquioxane-based resin, an ultraviolet-curable acrylic resin, and an ultraviolet-curable vinyl-based resin.

12. The optical filter according to claim 8, wherein the resin layer comprises a transparent resin, and
 wherein the transparent resin is at least one resin selected from the group consisting of a cyclic polyolefin-based resin, an aromatic polyether-based resin, a polyimide-based resin, a fluorene polycarbonate-based resin, a fluorene polyester-based resin, a polycarbonate-based resin, a polyamide-based resin, a polyarylate-based resin, a polysulfone-based resin, a polyether sulfone-based resin, a polyparaphenylene-based resin, a polyamide-imide-based resin, a polyethylene naphthalate-based resin, a fluorinated aromatic polymer-based resin, an acrylic resin, a modified acrylic resin, an epoxy based resin, a curable allyl ester-based resin, an ultraviolet-curable silsesquioxane-based resin, an ultraviolet-curable acrylic resin, and an ultraviolet-curable vinyl-based resin.

13. An electronic device, comprising the ambient light sensor according to claim 8.

14. The ambient light sensor according to claim 8, wherein the near-infrared absorbing fine particles are a metal oxide represented by a general formula MxWyOz,
 wherein
 M is one or a plurality of elements selected from H, alkali metals, alkaline earth metals, rare earth elements, Mg, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, F, P, S, Se, Br, Te, Ti, Nb, V, Mo, Ta, Re, Be, Hf, Os, Bi, and I;

W is tungsten;

O is oxygen;

$0.001 \leq x/y \leq 1$; and $2.2 \leq z/y \leq 3.0$.

15. The ambient light sensor according to claim 8, wherein the optical filter satisfies requirements (a) and (b) below:
 (a) in a wavelength range of 400 nm to 650 nm, an average of transmittance of any of light incident from a perpendicular direction to the optical filter, light obliquely incident at an angle of 30 degrees with respect to the perpendicular direction, and light obliquely incident at an angle of 60 degrees with respect to the perpendicular direction is 45% or higher and lower than 85%; and
 (b) in a wavelength range of 800 nm to 1,200 nm, an average of optical density (OD value) of any of light incident from the perpendicular direction to the optical filter, light obliquely incident at an angle of 30 degrees with respect to the perpendicular direction, and light obliquely incident at an angle of 60 degrees with respect to the perpendicular direction is 1.7 or higher.

* * * * *

UNITED STATES PATENT AND TRADEMARK OFFICE
CERTIFICATE OF CORRECTION

PATENT NO. : 11,226,442 B2
APPLICATION NO. : 16/239243
DATED : January 18, 2022
INVENTOR(S) : Katsuya Nagaya et al.

It is certified that error appears in the above-identified patent and that said Letters Patent is hereby corrected as shown below:

On the Title Page

Item (30), the Foreign Application Priority Data should read:
-- Foreign Application Priority Data
Jul. 28, 2015 (JP) .................. 2015-148692 --

Signed and Sealed this
Nineteenth Day of April, 2022

Katherine Kelly Vidal
*Director of the United States Patent and Trademark Office*